US011055613B2

(12) United States Patent
Ma

(10) Patent No.: US 11,055,613 B2
(45) Date of Patent: Jul. 6, 2021

(54) METHOD AND APPARATUS FOR A BINARY NEURAL NETWORK MAPPING SCHEME UTILIZING A GATE ARRAY ARCHITECTURE

(71) Applicant: Intel Corporation, Santa Clara, CA (US)

(72) Inventor: Liwei Ma, Beijing (CN)

(73) Assignee: Intel Corporation, Santa Clara, CA (US)

(*) Notice: Subject to any disclaimer, the term of this patent is extended or adjusted under 35 U.S.C. 154(b) by 231 days.

(21) Appl. No.: 16/463,764

(22) PCT Filed: Dec. 28, 2016

(86) PCT No.: PCT/CN2016/112721
§ 371 (c)(1),
(2) Date: May 23, 2019

(87) PCT Pub. No.: WO2018/119785
PCT Pub. Date: Jul. 5, 2018

(65) Prior Publication Data
US 2019/0392299 A1     Dec. 26, 2019

(51) Int. Cl.
*G06N 3/063*     (2006.01)
*G06F 7/544*     (2006.01)
(Continued)

(52) U.S. Cl.
CPC ......... *G06N 3/0635* (2013.01); *G06F 7/5443* (2013.01); *H03K 19/21* (2013.01); *H03K 19/23* (2013.01)

(58) Field of Classification Search
CPC ...... G06N 3/0635; H03K 19/21; H03K 19/23; G06F 7/5443
(Continued)

(56) References Cited

U.S. PATENT DOCUMENTS

| 5,720,002 A | 2/1998 | Wang |
| 6,754,645 B2 | 6/2004 | Shi et al. |
(Continued)

FOREIGN PATENT DOCUMENTS

| CN | 106056211 A | 10/2016 |
| WO | 2009078701 A2 | 6/2009 |

OTHER PUBLICATIONS

Courbariaux, Matthieu, et al., "Binarized Neural Networks: Traingin Neural Networks with Weights and Activations constrained to +1 or −1", accessed at https://anxiv.org/pdf/1602.02830.pdf, rev. 3 dated Mar. 17, 2016, 11 pages.
(Continued)

*Primary Examiner* — Tan V Mai
(74) *Attorney, Agent, or Firm* — Alliance IP, LLC

(57) ABSTRACT

In one embodiment, an apparatus comprises a plurality of bitwise multipliers, a bitwise multiplier of the plurality of bitwise multipliers to multiply a binary synapse weight value of a neural network by a binary activation state value of a neuron of the neural network. The apparatus further comprises a plurality of majority voters, a majority voter of the plurality of majority voters to receive outputs of a first group of bitwise multipliers and to generate a majority result to indicate whether a majority of outputs of the first group of bitwise multipliers are set to a first binary value or a second binary value. The apparatus also comprises a first plurality of reconfigurable connections coupled to outputs of the plurality of bitwise multipliers and inputs of the plurality of majority voters.

20 Claims, 18 Drawing Sheets

(51) Int. Cl.
*H03K 19/21* (2006.01)
*H03K 19/23* (2006.01)

(58) Field of Classification Search
USPC .......................................................... 708/230
See application file for complete search history.

(56) References Cited

U.S. PATENT DOCUMENTS

2018/0268601 A1* 9/2018 Rad ........................... G06T 7/75
2019/0130245 A1* 5/2019 Sakaguchi ............... G06N 3/02

OTHER PUBLICATIONS

Esser, Steven K., et al., "Convolutional Networks for Fast, Energy-Efficient Neuromorphic Computing", accessed at: https://arxiv.org/pdf/1603.08270.pdf, rev. 2 dated May 24, 2016, 7 pages.
International Search Report dated Sep. 27, 2017 for PCT/CN2016/112721, 3 pages.
Li, Fengfu, et al., "Ternary weight networks", accessed at: https://arxiv.org/pdf/1605.04711.pdf, rev. 2 dated Nov. 19, 2016, 5 pages.
Rastegari, Mohammad, et al., "XNOR-Net: ImageNet Classification Using Binary Convolutional Neural Networks", accessed at: https://arxiv.org/pdf/1603.05279.pdf, rev. 4 dated Aug. 2, 2016, 17 pages.
Written Opinion of the International Searching Authority dated Sep. 27, 2017 for PCT/CN2016/112721, 3 pages.

\* cited by examiner

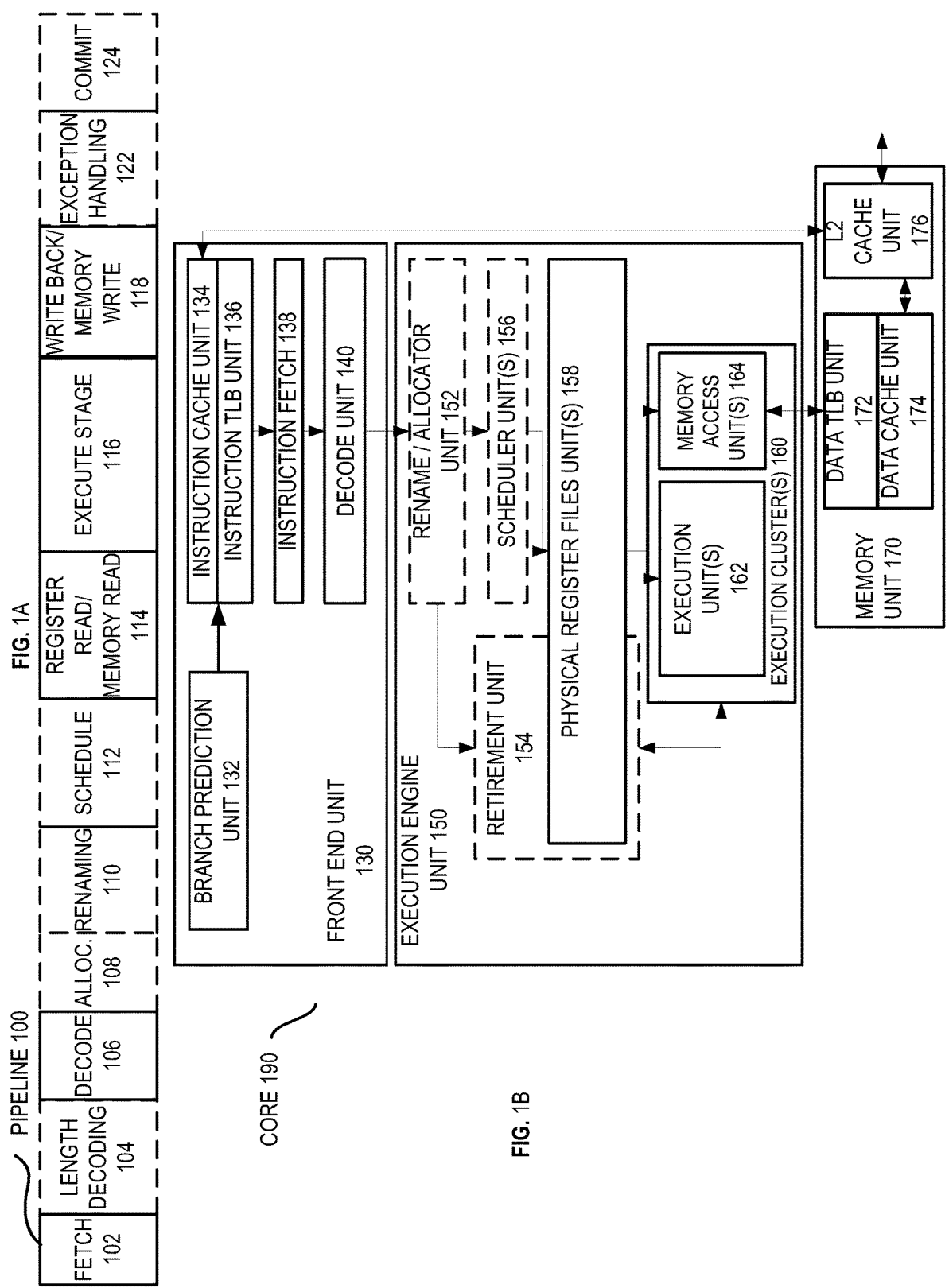

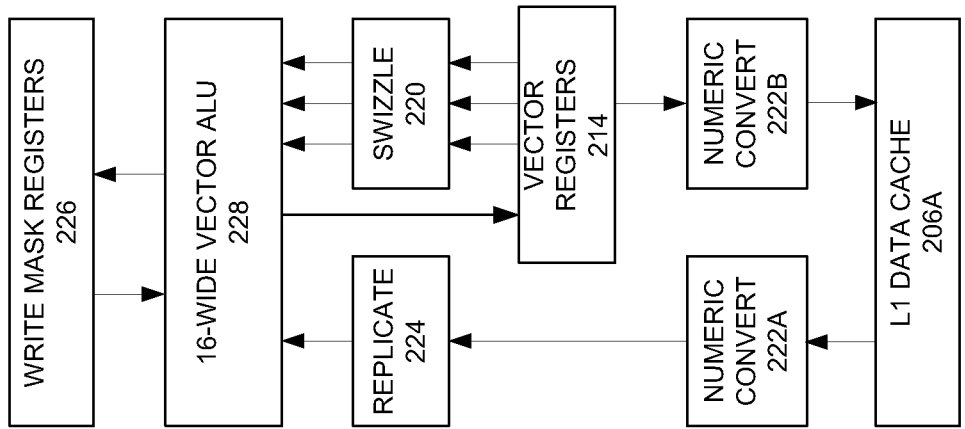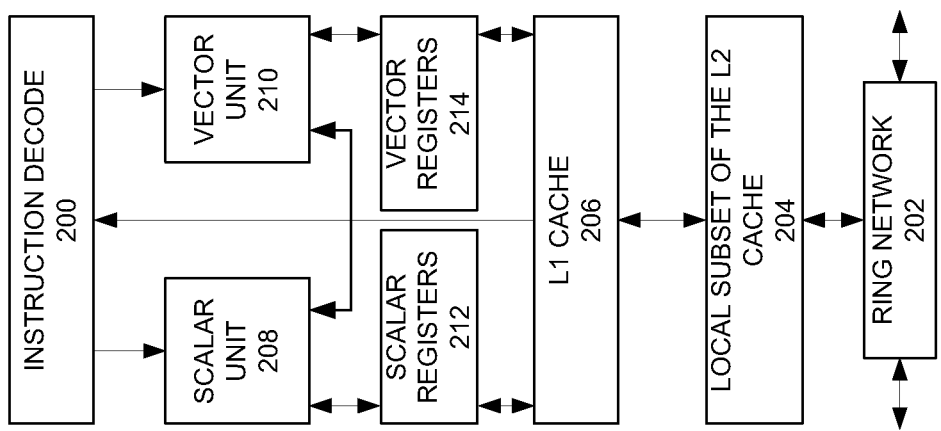

METHOD AND APPARATUS FOR A BINARY NEURAL NETWORK MAPPING SCHEME UTILIZING A GATE ARRAY ARCHITECTURE

CROSS-REFERENCE TO RELATED APPLICATIONS

This application is a national stage application under 35 U.S.C. § 371 of PCT International Application Serial No. PCT/CN2016/112721, filed on Dec. 28, 2016, and entitled METHOD AND APPARATUS FOR A BINARY NEURAL NETWORK MAPPING SCHEME UTILIZING A GATE ARRAY ARCHITECTURE. The disclosure of the prior application is considered part of and is hereby incorporated by reference in its entirety in the disclosure of this application.

FIELD

The present disclosure relates in general to the field of computer development, and more specifically, to an architecture for a neural network.

BACKGROUND

A neural network may include a group of neurons loosely modeled after the structure of a biological brain which includes large clusters of neurons connected by axons. In a neural network, neurons are connected to other neurons via links which may be excitatory or inhibitory in their effect on the activation state of connected neurons. A neuron may perform a function utilizing the values of its inputs to update a membrane potential of the neuron. A neuron may propagate a signal to connected neurons based on its activation state. A neural network may be trained or otherwise adapted to perform various data processing tasks, such as computer vision tasks, speech recognition tasks, or other suitable computing tasks.

BRIEF DESCRIPTION OF THE DRAWINGS

FIG. 1A is a block diagram illustrating both an exemplary in-order pipeline and an exemplary register renaming, out-of-order issue/execution pipeline in accordance with certain embodiments.

FIG. 1B is a block diagram illustrating both an exemplary embodiment of an in-order architecture core and an exemplary register renaming, out-of-order issue/execution architecture core to be included in a processor in accordance with certain embodiments.

FIGS. 2A-B illustrate a block diagram of a more specific exemplary in-order core architecture, which core would be one of several logic blocks (potentially including other cores of the same type and/or different types) in a chip in accordance with certain embodiments.

Like reference numbers and designations in the various drawings indicate like elements.

DETAILED DESCRIPTION

Figure 3:
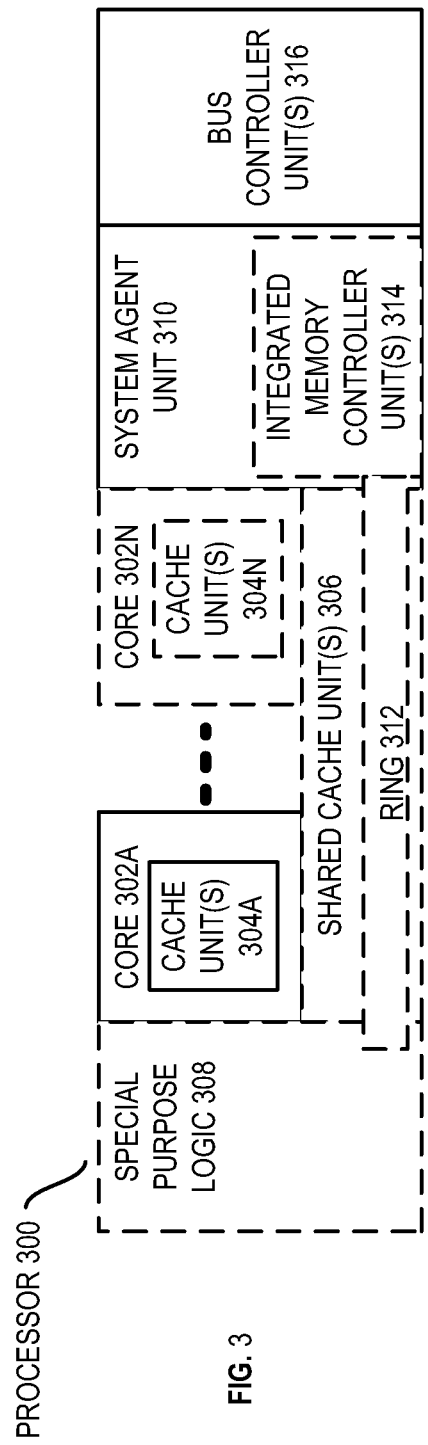
FIG. 3 is a block diagram of a processor that may have more than one core, may have an integrated memory controller, and may have integrated graphics in accordance with certain embodiments.

Various computer systems and components (e.g., processors, coprocessors, cores, and other components) in which various embodiments of the disclosure may be implemented and/or by which various functions described herein may be performed are described in FIGS. 1-8. Specific examples further describing various embodiments associated with a gate array architecture for a binary neural network are described in FIGS. 9-21.

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 1A is a block diagram illustrating both an exemplary in-order pipeline and an exemplary register renaming, out-of-order issue/execution pipeline according to embodiments of the disclosure. FIG. 1B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 1A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 1A, a processor pipeline 100 includes a fetch stage 102, a length decode stage 104, a decode stage 106, an allocation stage 108, a renaming stage 110, a scheduling (also known as a dispatch or issue) stage 112, a register read/memory read stage 114, an execute stage 116, a write back/memory write stage 118, an exception handling stage 122, and a commit stage 124.

FIG. 1B shows processor core 190 including a front end unit 130 coupled to an execution engine unit 150, and both are coupled to a memory unit 170. The core 190 may be a reduced instruction set computing (RISC) core, a complex instruction set computing (CISC) core, a very long instruction word (VLIW) core, or a hybrid or alternative core type. As yet another option, the core 190 may be a special-purpose core, such as, for example, a network or communication core, compression and/or decompression engine, coprocessor core, general purpose computing graphics processing unit (GPGPU) core, graphics core, or the like.

The front end unit 130 includes a branch prediction unit 132 coupled to an instruction cache unit 134, which is coupled to an instruction translation lookaside buffer (TLB) 136, which is coupled to an instruction fetch unit 138, which is coupled to a decode unit 140. The decode unit 140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 190 includes a microcode ROM or other medium that stores microcode for certain macroinstructions (e.g., in decode unit 140 or otherwise within the front end unit 130). The decode unit 140 is coupled to a rename/allocator unit 152 in the execution engine unit 150.

The execution engine unit 150 includes the rename/allocator unit 152 coupled to a retirement unit 154 and a set of one or more scheduler unit(s) 156. The scheduler unit(s) 156 represents any number of different schedulers, including reservations stations, central instruction window, etc. The scheduler unit(s) 156 is coupled to the physical register file(s) unit(s) 158. Each of the physical register file(s) units 158 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 158 comprises a vector registers unit, a write mask registers unit, and a scalar registers unit. These register units may provide architectural vector registers, vector mask registers, and general purpose registers. The physical register file(s) unit(s) 158 is overlapped by the retirement unit 154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 154 and the physical register file(s) unit(s) 158 are coupled to the execution cluster(s) 160. The execution cluster(s) 160 includes a set of one or more execution units 162 and a set of one or more memory access units 164. The execution units 162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 156, physical register file(s) unit(s) 158, and execution cluster(s) 160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 164). It should also be understood that where separate pipelines are used, one or more of these pipelines may be out-of-order issue/execution and the rest in-order.

The set of memory access units 164 is coupled to the memory unit 170, which includes a data TLB unit 172 coupled to a data cache unit 174 coupled to a level 2 (L2) cache unit 176. In one exemplary embodiment, the memory access units 164 may include a load unit, a store address unit, and a store data unit, each of which is coupled to the data TLB unit 172 in the memory unit 170. The instruction cache unit 134 is further coupled to a level 2 (L2) cache unit 176 in the memory unit 170. The L2 cache unit 176 is coupled to one or more other levels of cache and eventually to a main memory.

By way of example, the exemplary register renaming, out-of-order issue/execution core architecture may implement the pipeline 100 as follows: 1) the instruction fetch 138 performs the fetch and length decoding stages 102 and 104; 2) the decode unit 140 performs the decode stage 106; 3) the rename/allocator unit 152 performs the allocation stage 108 and renaming stage 110; 4) the scheduler unit(s) 156 performs the schedule stage 112; 5) the physical register file(s) unit(s) 158 and the memory unit 170 perform the register read/memory read stage 114; the execution cluster 160 perform the execute stage 116; 6) the memory unit 170 and the physical register file(s) unit(s) 158 perform the write back/memory write stage 118; 7) various units may be involved in the exception handling stage 122; and 8) the retirement unit 154 and the physical register file(s) unit(s) 158 perform the commit stage 124.

The core 190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 190 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 134/174 and a shared L2 cache unit 176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIGS. 2A-B illustrate a block diagram of a more specific exemplary in-order core architecture, which core would be one of several logic blocks (potentially including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 2A is a block diagram of a single processor core, along with its connection to the on-die interconnect network 202 and with its local subset of the Level 2 (L2) cache 204, according to various embodiments. In one embodiment, an instruction decoder 200 supports the x86 instruction set with a packed data instruction set extension. An L1 cache 206 allows low-latency accesses to cache memory into the scalar and vector units. While in one embodiment (to simplify the design), a scalar unit 208 and a vector unit 210 use separate register sets (respectively, scalar registers 212 and vector registers 214) and data transferred between them is written to memory and then read back in from a level 1 (L1) cache 206, alternative embodiments may use a different approach (e.g., use a single register set or include a communication path that allow data to be transferred between the two register files without being written and read back).

The local subset of the L2 cache 204 is part of a global L2 cache that is divided into separate local subsets (in some embodiments one per processor core). Each processor core has a direct access path to its own local subset of the L2 cache 204. Data read by a processor core is stored in its L2 cache subset 204 and can be accessed quickly, in parallel with other processor cores accessing their own local L2 cache subsets. Data written by a processor core is stored in its own L2 cache subset 204 and is flushed from other subsets, if necessary. The ring network ensures coherency for shared data. The ring network is bi-directional to allow agents such as processor cores, L2 caches and other logic blocks to communicate with each other within the chip. In a particular embodiment, each ring data-path is 1012-bits wide per direction.

FIG. 2B is an expanded view of part of the processor core in FIG. 2A according to embodiments. FIG. 2B includes an L1 data cache 206A (part of the L1 cache 206), as well as more detail regarding the vector unit 210 and the vector registers 214. Specifically, the vector unit 210 is a 16-wide vector processing unit (VPU) (see the 16-wide arithmetic logic unit (ALU) 228), which executes one or more of integer, single-precision float, and double-precision float instructions. The VPU supports swizzling the register inputs with swizzle unit 220, numeric conversion with numeric convert units 222A-B, and replication with replication unit 224 on the memory input. Write mask registers 226 allow predicating resulting vector writes.

FIG. 3 is a block diagram of a processor 300 that may have more than one core, may have an integrated memory controller, and may have integrated graphics according to various embodiments. The solid lined boxes in FIG. 3 illustrate a processor 300 with a single core 302A, a system agent 310, and a set of one or more bus controller units 316; while the optional addition of the dashed lined boxes illustrates an alternative processor 300 with multiple cores 302A-N, a set of one or more integrated memory controller unit(s) 314 in the system agent unit 310, and special purpose logic 308.

Thus, different implementations of the processor 300 may include: 1) a CPU with the special purpose logic 308 being integrated graphics and/or scientific (throughput) logic (which may include one or more cores), and the cores 302A-N being one or more general purpose cores (e.g., general purpose in-order cores, general purpose out-of-order cores, or a combination of the two); 2) a coprocessor with the cores 302A-N being a large number of special purpose cores intended primarily for graphics and/or scientific (throughput); and 3) a coprocessor with the cores 302A-N being a large number of general purpose in-order cores. Thus, the processor 300 may be a general-purpose processor, coprocessor or special-purpose processor, such as, for example, a network or communication processor, compression and/or decompression engine, graphics processor, GPGPU (general purpose graphics processing unit), a high-throughput many integrated core (MIC) coprocessor (e.g., including 30 or more cores), embedded processor, or other fixed or configurable logic that performs logical operations. The processor may be implemented on one or more chips. The processor 300 may be a part of and/or may be implemented on one or more substrates using any of a number of process technologies, such as, for example, BiCMOS, CMOS, or NMOS.

In various embodiments, a processor may include any number of processing elements that may be symmetric or asymmetric. In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The memory hierarchy includes one or more levels of cache within the cores, a set or one or more shared cache units 306, and external memory (not shown) coupled to the set of integrated memory controller units 314. The set of shared cache units 306 may include one or more mid-level caches, such as level 2 (L2), level 3 (L3), level 4 (L4), or other levels of cache, a last level cache (LLC), and/or combinations thereof. While in one embodiment a ring based interconnect unit 312 interconnects the special purpose logic (e.g., integrated graphics logic) 308, the set of shared cache units 306, and the system agent unit 310/ integrated memory controller unit(s) 314, alternative embodiments may use any number of well-known techniques for interconnecting such units. In one embodiment, coherency is maintained between one or more cache units 306 and cores 302A-N.

In some embodiments, one or more of the cores 302A-N are capable of multithreading. The system agent 310 includes those components coordinating and operating cores 302A-N. The system agent unit 310 may include for example a power control unit (PCU) and a display unit. The PCU may be or include logic and components needed for regulating the power state of the cores 302A-N and the special purpose logic 308. The display unit is for driving one or more externally connected displays.

The cores 302A-N may be homogenous or heterogeneous in terms of architecture instruction set; that is, two or more of the cores 302A-N may be capable of executing the same instruction set, while others may be capable of executing only a subset of that instruction set or a different instruction set.

FIGS. 4-7 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable for performing the methods described in this disclosure. In general, a huge variety of systems or electronic devices capable of incorporating a processor and/or other execution logic as disclosed herein are generally suitable.

Figure 4:
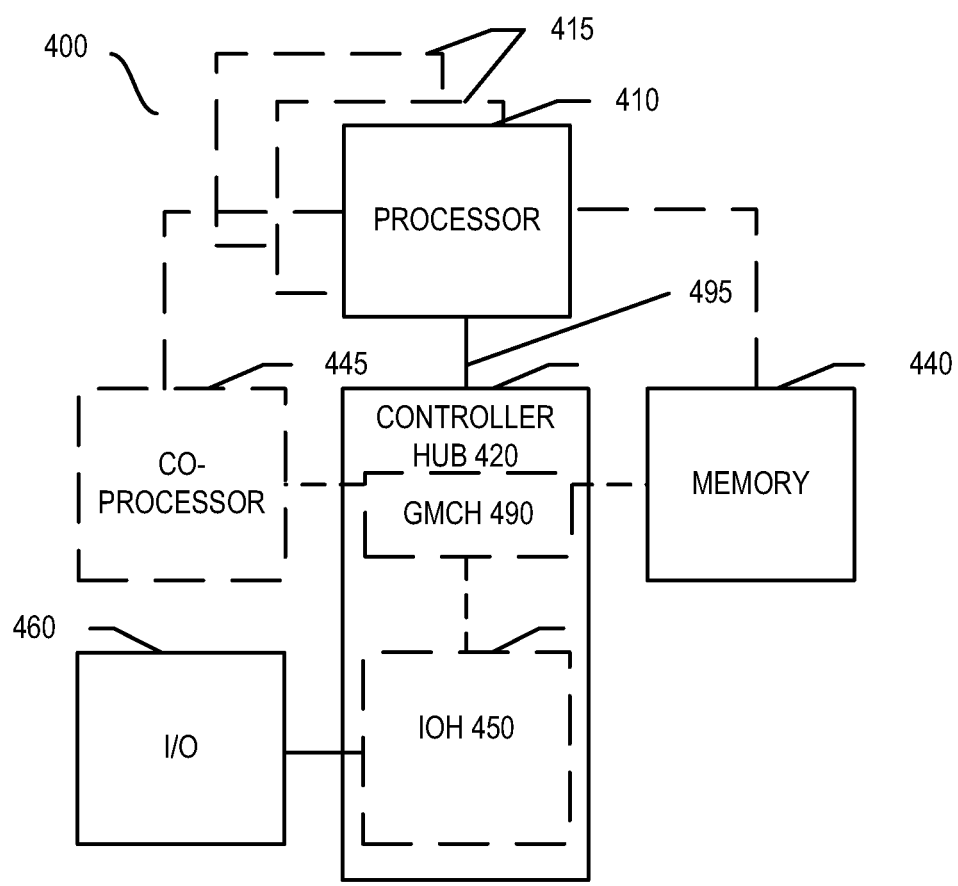
FIGS. 4-7 are block diagrams of exemplary computer architectures in accordance with certain embodiments.

FIG. 4 depicts a block diagram of a system 400 in accordance with one embodiment of the present disclosure. The system 400 may include one or more processors 410, 415, which are coupled to a controller hub 420. In one embodiment the controller hub 420 includes a graphics memory controller hub (GMCH) 490 and an Input/Output Hub (IOH) 450 (which may be on separate chips or the same chip); the GMCH 490 includes memory and graphics controllers coupled to memory 440 and a coprocessor 445; the IOH 450 couples input/output (I/O) devices 460 to the GMCH 490. Alternatively, one or both of the memory and graphics controllers are integrated within the processor (as described herein), the memory 440 and the coprocessor 445 are coupled directly to the processor 410, and the controller hub 420 is a single chip comprising the IOH 450.

The optional nature of additional processors 415 is denoted in FIG. 4 with broken lines. Each processor 410, 415 may include one or more of the processing cores described herein and may be some version of the processor 300.

The memory 440 may be, for example, dynamic random access memory (DRAM), phase change memory (PCM), other suitable memory, or any combination thereof. The memory 440 may store any suitable data, such as data used by processors 410, 415 to provide the functionality of computer system 400. For example, data associated with programs that are executed or files accessed by processors 410, 415 may be stored in memory 440. In various embodiments, memory 440 may store data and/or sequences of instructions that are used or executed by processors 410, 415.

In at least one embodiment, the controller hub 420 communicates with the processor(s) 410, 415 via a multi-drop bus, such as a frontside bus (FSB), point-to-point interface such as QuickPath Interconnect (QPI), or similar connection 495.

In one embodiment, the coprocessor 445 is a special-purpose processor, such as, for example, a high-throughput MIC processor, a network or communication processor, compression and/or decompression engine, graphics processor, GPGPU, embedded processor, or the like. In one embodiment, controller hub 420 may include an integrated graphics accelerator.

There can be a variety of differences between the physical resources 410, 415 in terms of a spectrum of metrics of merit including architectural, microarchitectural, thermal, power consumption characteristics, and the like.

In one embodiment, the processor 410 executes instructions that control data processing operations of a general type. Embedded within the instructions may be coprocessor instructions. The processor 410 recognizes these coprocessor instructions as being of a type that should be executed by the attached coprocessor 445. Accordingly, the processor 410 issues these coprocessor instructions (or control signals representing coprocessor instructions) on a coprocessor bus or other interconnect, to coprocessor 445. Coprocessor(s) 445 accept and execute the received coprocessor instructions.

Figure 5:
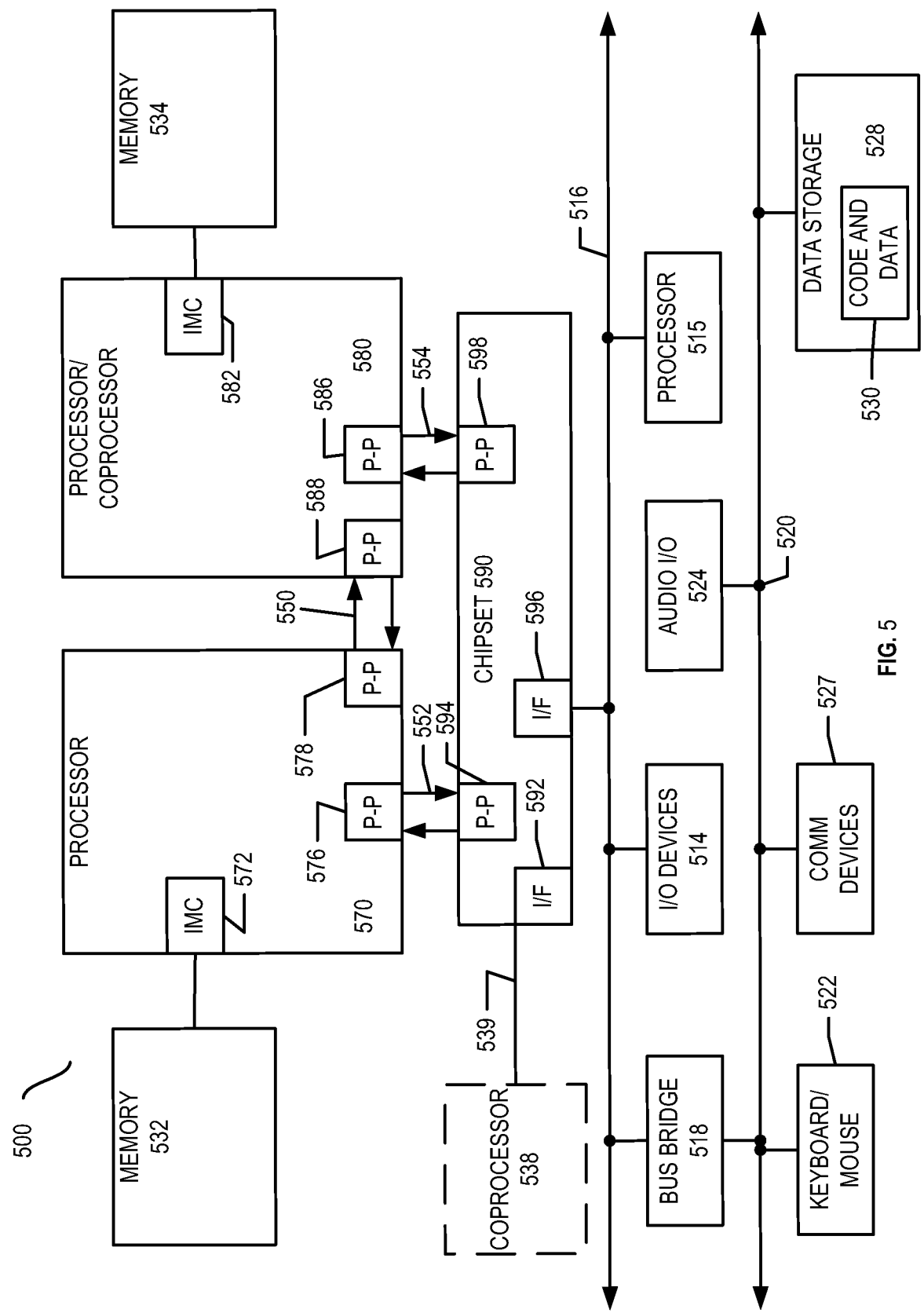

FIG. 5 depicts a block diagram of a first more specific exemplary system 500 in accordance with an embodiment of the present disclosure. As shown in FIG. 5, multiprocessor system 500 is a point-to-point interconnect system, and includes a first processor 570 and a second processor 580 coupled via a point-to-point interconnect 550. Each of processors 570 and 580 may be some version of the processor 300. In one embodiment of the disclosure, processors 570 and 580 are respectively processors 410 and 415, while coprocessor 538 is coprocessor 445. In another embodiment, processors 570 and 580 are respectively processor 410 and coprocessor 445.

Processors 570 and 580 are shown including integrated memory controller (IMC) units 572 and 582, respectively. Processor 570 also includes as part of its bus controller units point-to-point (P-P) interfaces 576 and 578; similarly, second processor 580 includes P-P interfaces 586 and 588. Processors 570, 580 may exchange information via a point-to-point (P-P) interface 550 using P-P interface circuits 578, 588. As shown in FIG. 5, IMCs 572 and 582 couple the processors to respective memories, namely a memory 532 and a memory 534, which may be portions of main memory locally attached to the respective processors.

Processors 570, 580 may each exchange information with a chipset 590 via individual P-P interfaces 552, 554 using point to point interface circuits 576, 594, 586, 598. Chipset 590 may optionally exchange information with the coprocessor 538 via a high-performance interface 539. In one embodiment, the coprocessor 538 is a special-purpose processor, such as, for example, a high-throughput MIC processor, a network or communication processor, compression and/or decompression engine, graphics processor, GPGPU, embedded processor, or the like.

A shared cache (not shown) may be included in either processor or outside of both processors, yet connected with the processors via a P-P interconnect, such that either or both processors' local cache information may be stored in the shared cache if a processor is placed into a low power mode.

Chipset 590 may be coupled to a first bus 516 via an interface 596. In one embodiment, first bus 516 may be a Peripheral Component Interconnect (PCI) bus, or a bus such as a PCI Express bus or another third generation I/O interconnect bus, although the scope of the present disclosure is not so limited.

As shown in FIG. 5, various I/O devices 514 may be coupled to first bus 516, along with a bus bridge 518 which couples first bus 516 to a second bus 520. In one embodiment, one or more additional processor(s) 515, such as coprocessors, high-throughput MIC processors, GPGPU's, accelerators (such as, e.g., graphics accelerators or digital signal processing (DSP) units), field programmable gate arrays, or any other processor, are coupled to first bus 516. In one embodiment, second bus 520 may be a low pin count (LPC) bus. Various devices may be coupled to a second bus 520 including, for example, a keyboard and/or mouse 522, communication devices 527 and a storage unit 528 such as a disk drive or other mass storage device which may include instructions/code and data 530, in one embodiment. Further, an audio I/O 524 may be coupled to the second bus 520. Note that other architectures are contemplated by this disclosure. For example, instead of the point-to-point architecture of FIG. 5, a system may implement a multi-drop bus or other such architecture.

Figure 6:
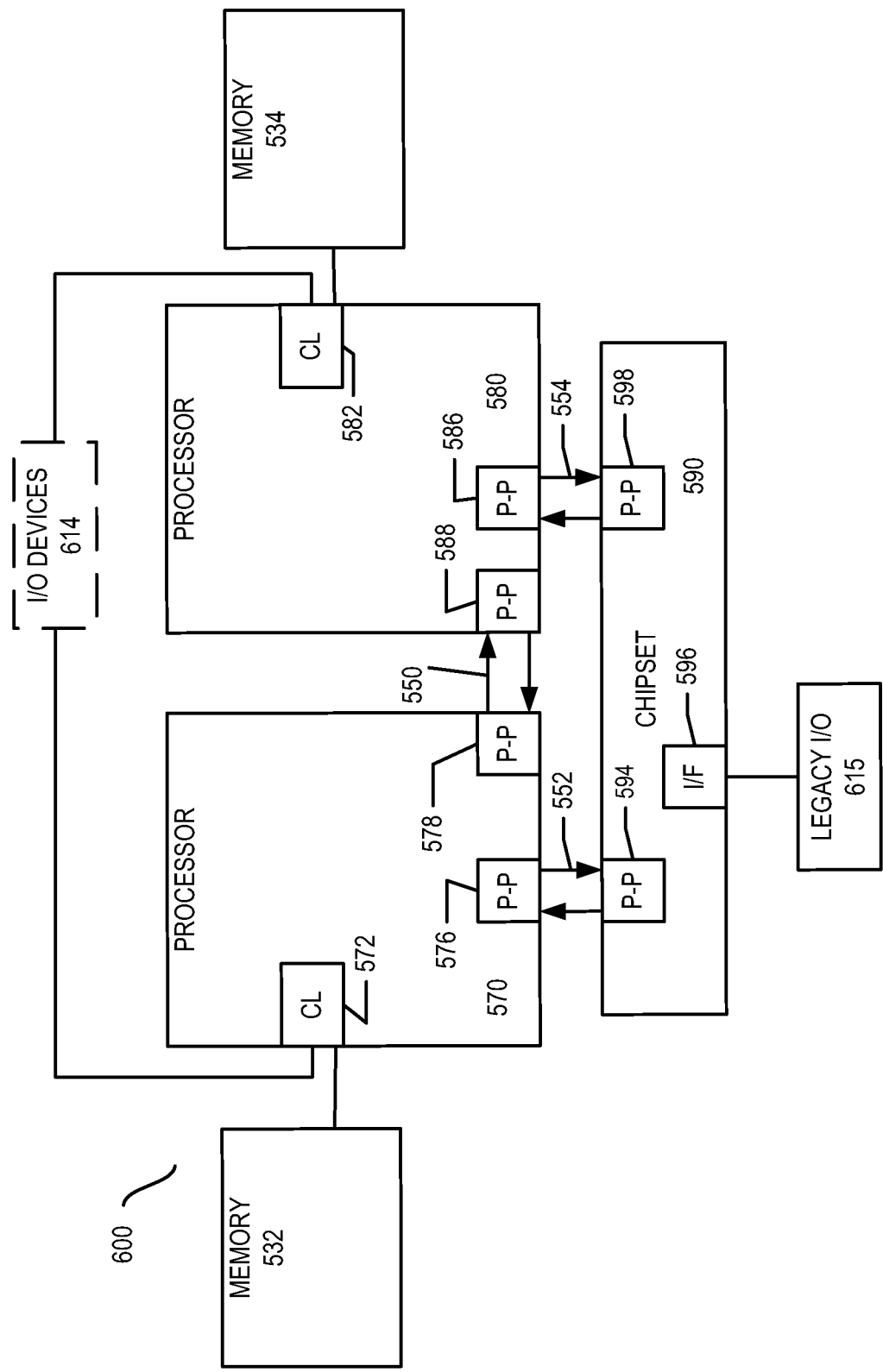

FIG. 6 depicts a block diagram of a second more specific exemplary system 600 in accordance with an embodiment of the present disclosure. Similar elements in FIGS. 5 and 6 bear similar reference numerals, and certain aspects of FIG. 5 have been omitted from FIG. 6 in order to avoid obscuring other aspects of FIG. 6.

FIG. 6 illustrates that the processors 570, 580 may include integrated memory and I/O control logic ("CL") 572 and 582, respectively. Thus, the CL 572, 582 include integrated memory controller units and include I/O control logic. FIG. 6 illustrates that not only are the memories 532, 534 coupled to the CL 572, 582, but also that I/O devices 614 are also coupled to the control logic 572, 582. Legacy I/O devices 615 are coupled to the chipset 590.

Figure 7:
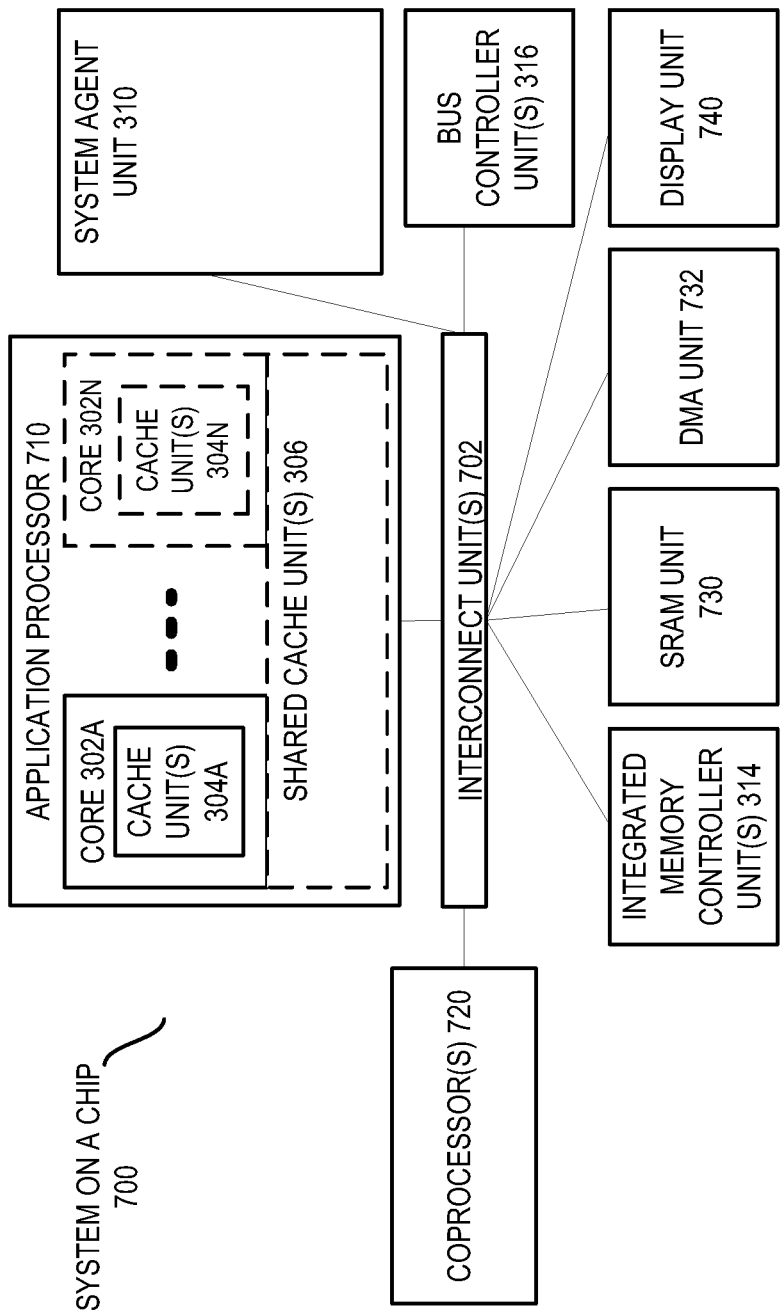

FIG. 7 depicts a block diagram of a SoC 700 in accordance with an embodiment of the present disclosure. Similar elements in FIG. 3 bear similar reference numerals. Also, dashed lined boxes are optional features on more advanced SoCs. In FIG. 7, an interconnect unit(s) 702 is coupled to: an application processor 710 which includes a set of one or more cores 202A-N and shared cache unit(s) 306; a system agent unit 310; a bus controller unit(s) 316; an integrated memory controller unit(s) 314; a set or one or more coprocessors 720 which may include integrated graphics logic, an image processor, an audio processor, and a video processor; an static random access memory (SRAM) unit 730; a direct memory access (DMA) unit 732; and a display unit 740 for coupling to one or more external displays. In one embodiment, the coprocessor(s) 720 include a special-purpose processor, such as, for example, a network or communication processor, compression and/or decompression engine, GPGPU, a high-throughput MIC processor, embedded processor, or the like.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 8:
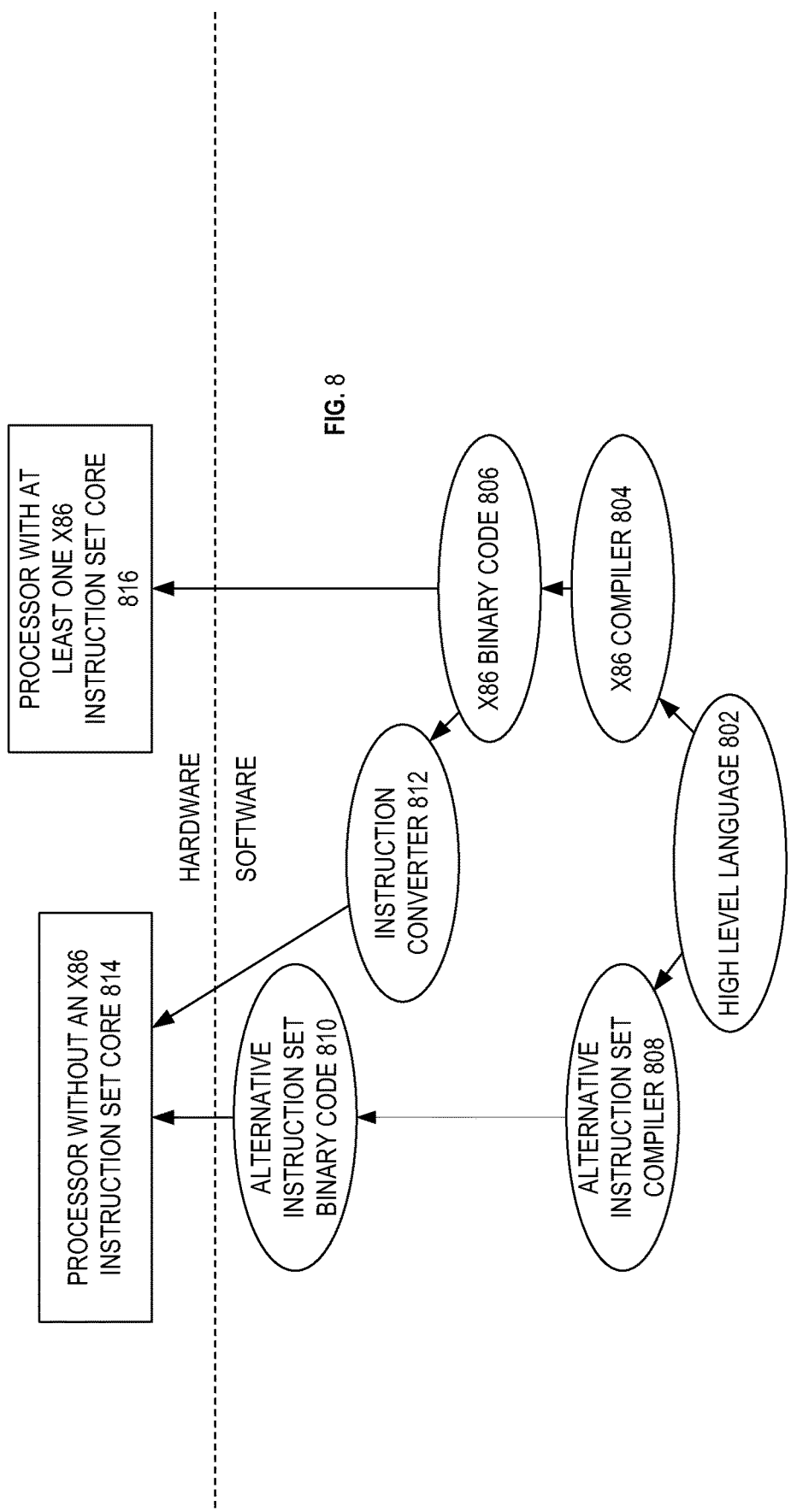
FIG. 8 is a block diagram contrasting the use of a software instruction converter to convert binary instructions in a source instruction set to binary instructions in a target instruction set in accordance with certain embodiments.

FIG. 8 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 8 shows a program in a high level language 802 may be compiled using an x86 compiler 804 to generate x86 binary code 806 that may be natively executed by a processor with at least one x86 instruction set core 816. The processor with at least one x86 instruction set core 816 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 804 represents a compiler that is operable to generate x86 binary code 806 (e.g., object code) that can, with or without additional linkage processing, be executed on the processor with at least one x86 instruction set core 816. Similarly, FIG. 8 shows the program in the high level language 802 may be compiled using an alternative instruction set compiler 808 to generate alternative instruction set binary code 810 that may be natively executed by a processor without at least one x86 instruction set core 814 (e.g., a processor with cores that execute the MIPS instruction set of MIPS Technologies of Sunnyvale, Calif. and/or that execute the ARM instruction set of ARM Holdings of Sunnyvale, Calif.). The instruction converter 812 is used to convert the x86 binary code 806 into code that may be natively executed by the processor without an x86 instruction set core 814. This converted code is not likely to be the same as the alternative instruction set binary code 810 because an instruction converter capable of this is difficult to make; however, the converted code will accomplish the general operation and be made up of instructions from the alternative instruction set. Thus, the instruction converter 812 represents software, firmware, hardware, or a combination thereof that, through emulation, simulation or any other process, allows a processor or other electronic device that does not have an x86 instruction set processor or core to execute the x86 binary code 806.

Figure 9:
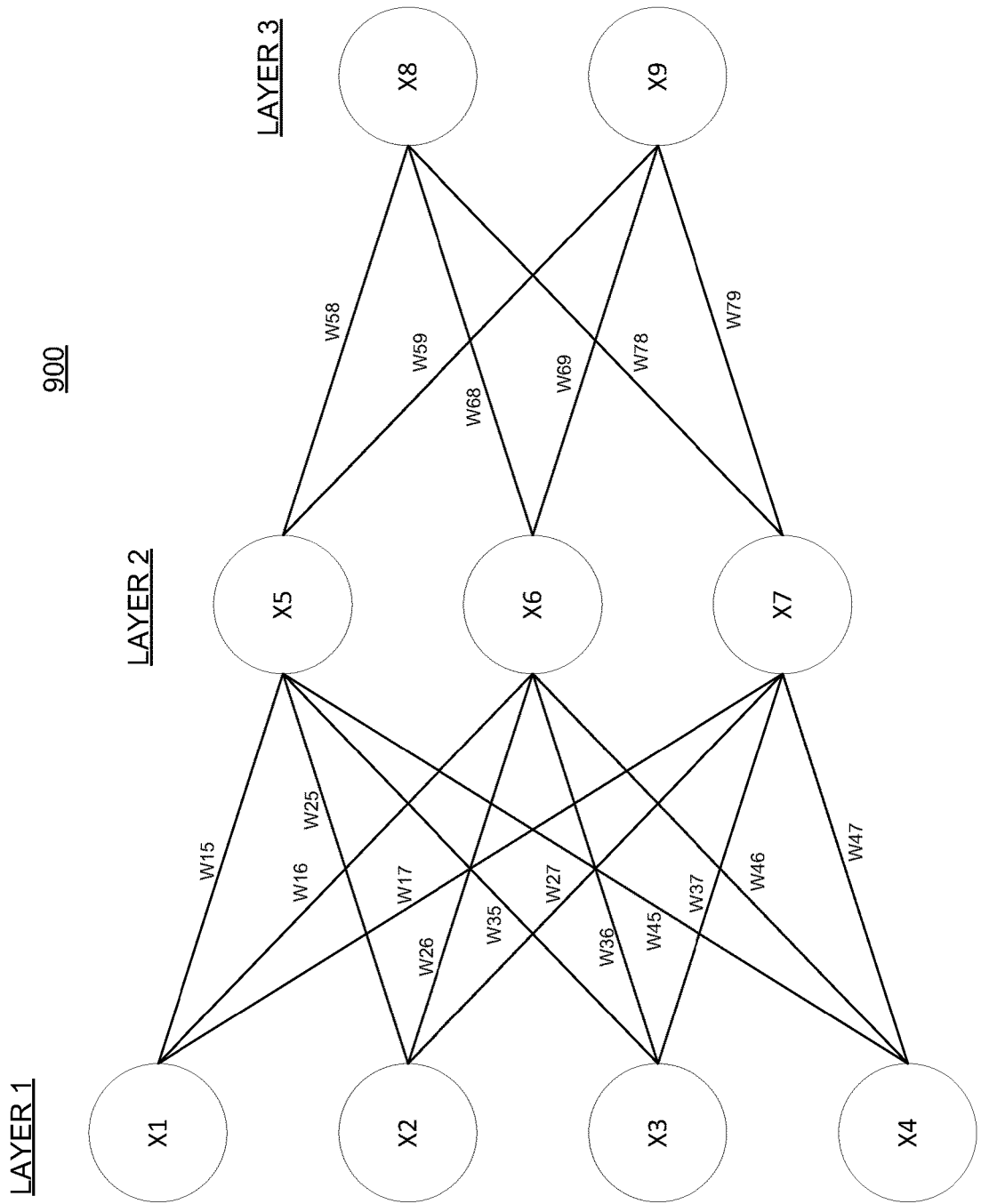
FIG. 9 illustrates a portion of an example neural network in accordance with certain embodiments.

FIG. 9 illustrates an example portion of a neural network 900 in accordance with certain embodiments. The neural network 900 includes neurons X1-X9. Neurons X1-X4 reside in layer 1, neurons X5-X7 reside in layer 2, and neurons X8 and X9 reside in layer 3. The layers may represent any suitable abstraction or grouping of a neural network. For example, a layer may be an input layer, a hidden layer, an output layer, a convolutional layer, a pooling layer, or other suitable layer. In various embodiments, the layers may overlap. For example, a neuron of an input layer could also be an output neuron in some embodiments. In one example, the neurons of layer 1 are input neurons, the neurons of layer 2 are hidden neurons, and the neurons of layer 3 are output neurons. The input neurons may respectively receive primary inputs (which may be held constant while the neural network 900 processes an output), Any suitable primary inputs may be used. As one example, when neural network 900 performs image processing, a primary input value may be the value of a pixel from an image (and the value of the primary input may stay constant while the image is processed). As another example, when neural network 900 performs speech processing the primary input value applied to a particular input neuron may change over time based on changes to the input speech.

While a specific topology and connectivity scheme is shown in FIG. 9, the teachings of the present disclosure may be used in neural networks having any suitable topology and/or connectivity. In the embodiment depicted, each link between two neurons has a synaptic weight indicating the strength of the relationship between the two neurons. The synapse weights are depicted as WXY, where X indicates the pre-synaptic neuron and Y indicates the post-synaptic neuron. Links between the neurons may be excitatory or inhibitory in their effect on the activation state of connected neurons. For example, a signal that propagates from X1 to X5 may increase or decrease the membrane potential of X5 depending on the value of W15. In various embodiments, the connections may be directed or undirected.

In general, during each time-step of the neural network, a neuron may receive any suitable inputs, such as a bias value or one or more activation signals from one or more other neurons. The bias value applied to a neuron may be a function of a primary input applied to an input neuron and/or some other value applied to a neuron (e.g., a constant value that may be adjusted during training or other operation of the neural network). In various embodiments, each neuron may be associated with its own bias value or a bias value could be applied to multiple neurons. An activation signal may be a function of a fan-in neuron and a synapse weight for the connection between the neuron receiving the activation signal and the fan-in neuron.

The neuron may perform a function utilizing the values of its inputs and its current membrane potential. For example, in some embodiments, the inputs may be added to the current membrane potential of the neuron to generate an updated membrane potential. As another example, a non-linear function, such as a sigmoid transfer function, may be applied to the inputs and the current membrane potential. Any other suitable function may be used. The neuron then updates its membrane potential based on the output of the function. The neuron may send an activation signal to each of its fan-out neurons (i.e., the neurons connected to the output of the neuron) based on its membrane potential. For example, an activation signal from X1 may be propagated to X5, X6, and X7. As another example, an activation signal from X5 may be propagated to X8 and X9 (and in some embodiments to X2, X3, and X4).

In a particular embodiment, one or more memory arrays may comprise memory cells that store the synapse weights, membrane potentials, thresholds, outputs (e.g., the number of times that a neuron has spiked), bias amounts, or other values used during operation of the neural network 900. The number of bits used for each of these values may vary depending on the implementation. In the examples illustrated below, specific bit lengths and/or component sizes may be described with respect to particular elements, but in other embodiments any suitable bit lengths and/or component sizes may be used.

Various embodiments of the present disclosure provide an architecture for a binary neural network. Although various parameters of a neural network (e.g., membrane potentials/neuron activations, synapse weights, biases, etc.) may be stored using any suitable format such as floating point numbers, integers, or other formats, various hardware efficiencies may be obtained by minimizing the lengths of such parameters. In a binary neural network, the neuron activations, synapse weights, and/or biases may be quantized as being either −1 or +1, thus requiring only a single bit for each parameter. Such a network may avoid complicated addition and/or multiplication used in neural networks that use, e.g., 8 or 16 bit integers to represent such parameters. Though a binary neural network may be less accurate than a similarly sized (in terms of neurons) neural network that stores parameters using greater amounts of bits, the binary neural network drastically reduces network storage and computation resources on a per-neuron basis (in some cases by 60× to 100×). Accordingly, the width and depth of a binary neural network may be increased to compensate for or overcome the loss in accuracy without exceeding the resources used by a comparable neural network.

Various embodiments of the present disclosure provide binary neural network architectures using arrays of modular logic blocks coupled together via reconfigurable interconnects to form a desired neural network. The connectivity between the blocks may be reconfigurable. In one embodiment, the connectivity may be set based on a configuration file that is stored in a memory of a device that includes the arrays. In one embodiment, the device that includes the arrays of logic blocks is a field programmable gate array (FPGA) that includes arrays of logic blocks that are specially adapted to binary neural network computations, rather than standard logic blocks used by typical FPGAs, thus improving the performance of the binary neural network on the device. In various embodiments, the basic computations are performed by XNOR and XOR and the entire neural network be synthesized by a network of XOR gates and inverters or XNOR gates and inverters (along with some basic supporting logic). Various embodiments provide an array of basic computation logic blocks and switch boxes that may be programmed in field to implement a desired neural network.

Figure 10:
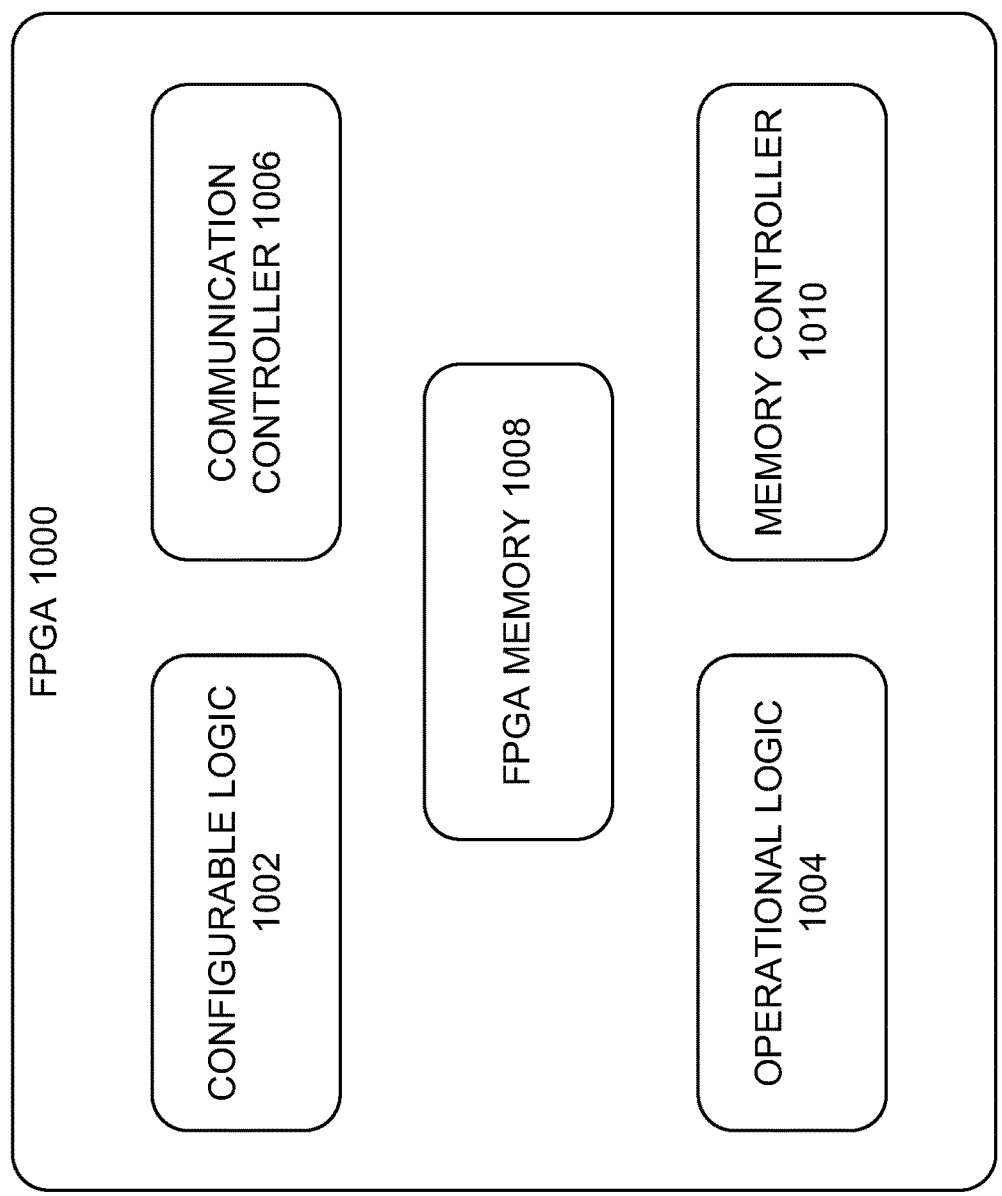
FIG. 10 illustrates an example field-programmable gate array (FPGA) in accordance with certain embodiments.

FIG. 10 illustrates an example block diagram of a field programmable gate array (FPGA) 1000 in accordance with certain embodiments. In various embodiments, FPGA 1000 or other device with configurable logic as described herein may be included within and/or coupled to any of the computer systems or components described above (or other suitable systems or components). In a particular embodiment, the logic block arrays and interconnect logic described herein may be included on an FPGA 1000 or other computing device.

An FPGA may be a semiconductor device that includes configurable logic. An FPGA may be programmed via a configuration file (e.g., a bitstream) having any suitable format that defines how the logic of the FPGA is to be configured. In various embodiments, the configuration file may be provided to the FPGA via any suitable means (e.g., via a scan chain). An FPGA may be reprogrammed any number of times after the FPGA is manufactured to implement various functions based on the connectivity of the logic blocks of the FPGA.

In the depicted embodiment, FPGA 1000 includes configurable logic 1002, operational logic 1004, communication controller 1006, FPGA memory 1008, and memory controller 1010. In various embodiments, the configurable logic includes arrays of XOR or XNOR gates or computational logic blocks including XOR or XNOR gates. The configurable logic 1002 may include any other suitable logic, such as memory elements, inverters, capacitors, amplifiers, demultiplexers, majority voters, or other hardware elements). In various embodiments, the configurable logic 1002 may include any of the logic described with respect to the figures below or other similar logic. In various embodiments, the logic is configured (at least in part) through programmable interconnects that connect logic components of the FPGA to each other.

Operational logic 1004 may utilize data from a configuration file stored in FPGA memory 1008 (e.g., nonvolatile flash memory, SRAM memory, DRAM memory, phase change memory, register files, or other suitable memory) defining the configuration of logic blocks and connectivity to configure the configurable logic 1002 according to the configuration file. Operational logic 1004 may perform other suitable operations of the FPGA. In various embodiments, control bits of the configuration file may operate to configure the logic (e.g., by activating or deactivating particular interconnects between portions of the configurable logic or by sending control signals to particular logic blocks). The operational logic 1004 may include any suitable logic (which may be implemented in configurable logic or fixed logic), such as one or more memory devices including any suitable type of memory (e.g., RAM), one or more transceivers, clocking circuitry, one or more processors located on the FPGA, one or more controllers, or other suitable logic.

Communication controller 1006 may enable FPGA 1000 to communicate with other components (e.g., a processor) of a computer system (e.g., to receive configuration files or operational commands or to communicate neural network inputs or outputs). Memory controller 1010 may enable the FPGA to read data (e.g., operands or results) from or write data to memory of a computer system. In various embodiments, memory controller 1010 may comprise a direct memory access (DMA) controller.

Figure 11:
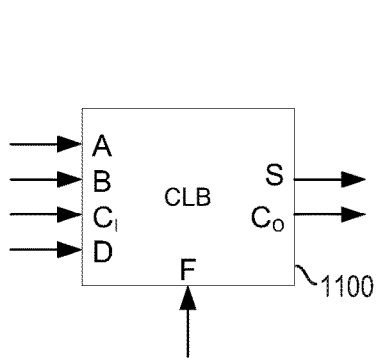
FIG. 11 illustrates an example computational logic block in accordance with certain embodiments.
Figure 12:
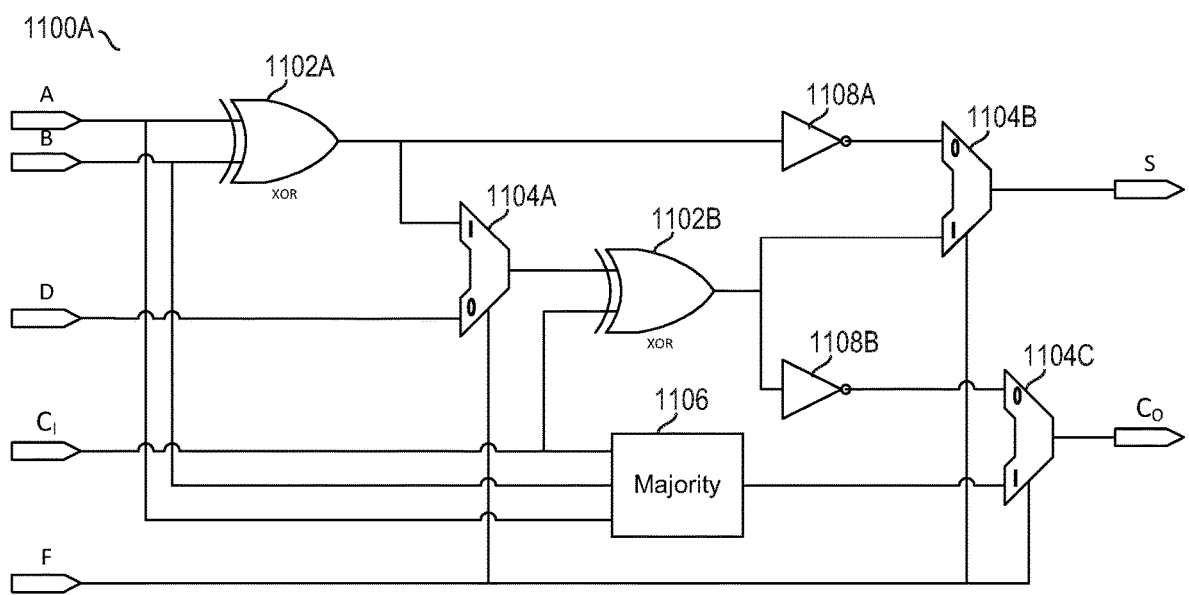
FIG. 12 illustrates example circuitry of an example computational logic block in accordance with certain embodiments.

FIG. 11 illustrates an example computational logic block (CLB) 1100 in accordance with certain embodiments. FIG. 12 illustrates an example circuit implementation 1100A of CLB 1100 in accordance with certain embodiments. CLB 1100 includes logic that may be used to perform an activation function for the neural network. For example, a neuron in a binary neural network may have a non-linear activation function of:

$$A = \text{sign}\left(\sum_i x_i w_i\right)$$

where A is the calculated activation state value of the neuron, $x_i$ is the activation state value (the activation state values may have a value of +1 or −1) of fan-in neuron i, and $w_i$ is a synapse weight value (which may have a value of +1 or −1 in a binary neural network) of the synapse between the neuron and the fan-in neuron i. The contribution of a bias (which may have a value of +1 or −1) to the neuron may be included in the summation by treating it as one of the incoming activation state values and setting the corresponding weight to +1. By way of example, a logic 1 may be used to represent the value of +1 and a logic 0 may be used to represent the value of −1.

Thus, calculation of the above activation function includes a series of bitwise multiplications ($x_i w_i$) and a determination of the sign (i.e., whether the result is positive or negative) of the sum of the results of the multiplications. If the sign is negative, the activation state value of the neuron is −1, if the sign is positive, the activation state value of the neuron is +1.

A truth table that relies on the assumption that a logical 0 represents the value −1 and a logical 1 represents the value +1 is shown below. The output tracks the output of an XNOR gate=$\overline{x \oplus w}$. Accordingly, in a particular embodiment, each bitwise multiplication ($x_i w_i$) may be performed by an XNOR gate that receives the respective synapse weight value and activation state value as inputs.

| Input x | Input w | Output |
|---|---|---|
| −1 (0) | −1 (0) | +1 (1) |
| −1 (0) | +1 (1) | −1 (0) |
| +1 (1) | −1 (0) | −1 (0) |
| +1 (1) | +1 (1) | +1 (1) |

In an embodiment, the sign determination of the activation function may be performed by a majority voter logic block which determines whether a majority of inputs to the logic block are logic 1s (corresponding to values of +1) or logic 0s (corresponding to values of −1). In a particular embodiment, a majority voter logic block may be constructed from an adder tree.

In a particular embodiment, CLB 1100 includes two bitwise multipliers (which may each be used to multiply a weight and an activation state) and a full adder (which could be coupled together with other full adders to implement a majority voter logic block). The CLB depicted in FIGS. 11 and 12 may function as follows:

```
If (F==0)
   S = A ⊕ B
   C_O = C_I ⊕ D
Else
   S = A ⊕ B ⊕ C_I
   C_O = AB + BC_I + C_I A
Endif
```

In other words, if the control signal F is equal to 0 (i.e., not activated), then the CLB is configured as two bitwise multipliers (S equals A times B, $C_O$ equals $C_I$ times D). However, if the control signal F is equal to 1 (i.e., activated), then the CLB is configured as a full adder that outputs the sum of A, B, and $C_I$ (where S is the least significant bit and $C_O$ is the carry bit).

FIG. 12 depicts one example circuit implementation of CLB 1100, although other embodiments may include any suitable circuit implementations that provide implementation of the functions described above. In the embodiment depicted, when F is low (i.e., logical 0), A and B are passed to XOR gate 1102A and the output of XOR gate 1102A is inverted by inverter 1108A and passed to output S. Similarly, $C_I$ and D are passed to XOR gate 1102B and the output of XOR gate 1102B is inverted by inverter 1108B and passed to output $C_O$. When F is high (i.e., logical 1), the output of XOR gate 1102A is input (along with $C_I$) to XOR gate 1102B to produce the output S. The majority voter logic block 1106 also determines whether the carry bit should be set to logical 1 based on whether at least two of the three inputs (A, B, and $C_I$) have a value of logical 1.

Figure 13:
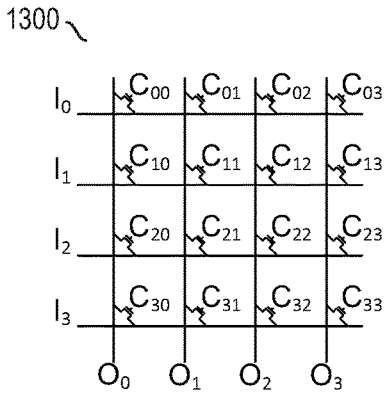
FIG. 13 illustrates example circuitry of an example switch block in accordance with certain embodiments.

FIG. 13 illustrates example circuitry of an example switch block 1300 in accordance with certain embodiments. An array of switch blocks 1300 (or other suitable reconfigurable interconnects) may be used to couple the CLBs (or other logic blocks described herein) together in order to implement the activation function described above. A switch block may comprise a plurality of inputs $I_i$ and a plurality of outputs $O_j$. A particular input $I_i$ may be coupled to a particular output $O_j$ of the switch block 1300 when an associated control signal $C_{ij}$ is activated. The values of the various control signals may be stored in a memory of the device (e.g., FPGA 1000) that includes the CLBs and switch blocks 1300 and held constant during operation of the neural network. In one embodiment, the control signal values are specified in a configuration file (e.g., a bitstream) sent to the device. In particular embodiments, the configuration file may also specify values of the control signals F for each (or at least a subset) of the CLBs 1100.

Figure 14:
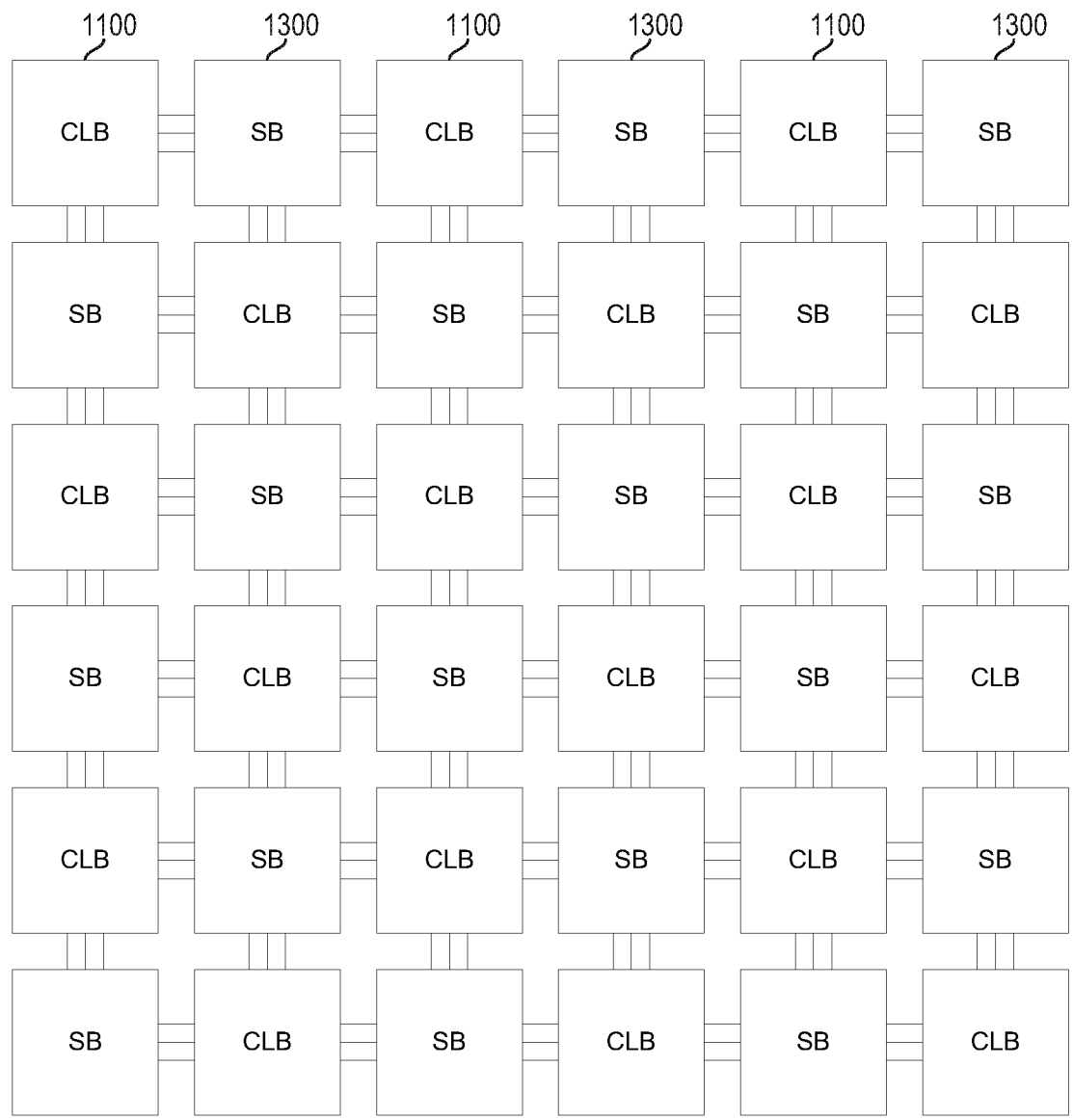
FIG. 14 illustrates an example arrangement of computational logic blocks and switch blocks in accordance with certain embodiments.

FIG. 14 illustrates an example arrangement of computational logic blocks (CLBs) 1100 and switch blocks (SBs) 1300 in accordance with certain embodiments. As depicted, the example arrangement includes an array of CLBs 1100 and an array of SBs 1300 with each CLB coupled to one or more SBs. A switch block 1300 may be configured (e.g., via a configuration file) to couple the output of a CLB 1100 to the input of another CLB 1100. In various embodiments, some switch blocks 1300 may be local switch blocks that couple neighboring CLBs to each other and other switch blocks 1300 may be global switch blocks that couple a CLB from one region of the device to another region of the device. The arrangement shown in FIG. 14 is for explanation purposes only, as the present disclosure contemplates any suitable arrangement of the CLBs and the switch blocks. SBs 1300 may also couple other logic elements (e.g., majority voter logic blocks, XOR gates, XNOR gates, amplifiers, storage elements, or other logic elements of the FPGA) together.

Figure 15:
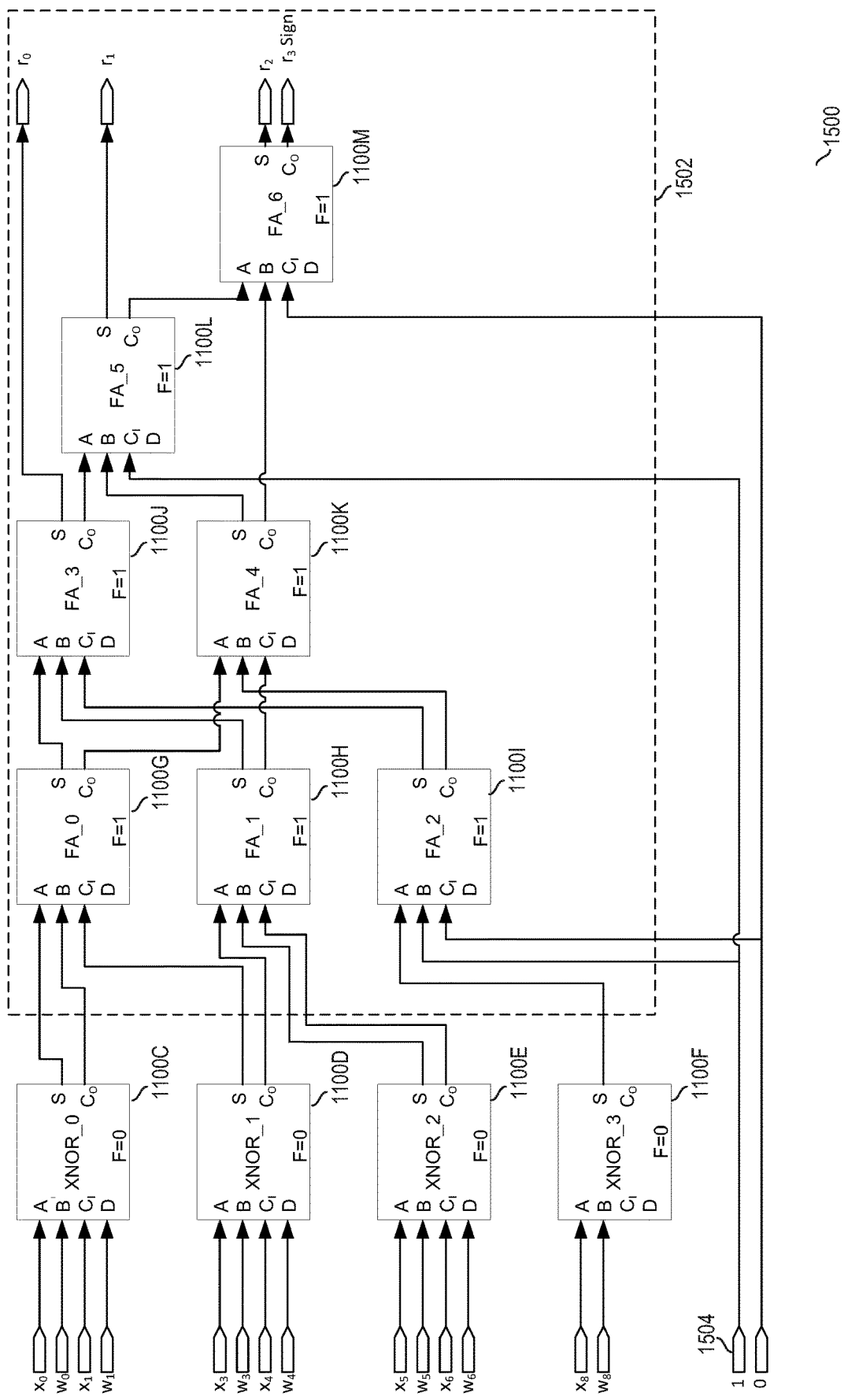
FIG. 15 illustrates an example arrangement of computational logic blocks to perform an activation function operation of a binary neural network in accordance with certain embodiments.

FIG. 15 illustrates an example arrangement of computational logic blocks 1100 to perform an activation function operation of a binary neural network in accordance with certain embodiments. The arrangement depicted in FIG. 15 demonstrates a portion of a full-connection layer of a neural network as an example (convolutional layers may be considered a special case of a full-connection layer). The arrangement performs the operation $A=\text{sign}(\Sigma_{i=0}^{8} x_i w_i)$, with weight values $w_2=0$ and $w_7=0$ (accordingly no bitwise multiplications are performed for these weight values and they may be omitted from the XNOR connections of the depicted circuit). The operation depicted may be, e.g., a 9×1 full connection computation or a 3×3 convolution computation.

In the embodiment depicted, the control signal F supplied to CLBs 1100C-1100F is set to 0, thus configuring each of these CLBs as two one-bit multipliers (each implemented by an XNOR gate). As mentioned earlier, weight values $w_2=0$ and $w_7=0$, so these weight values and their corresponding activation function values may be ignored and are not supplied to the CLBs. The results of the bitwise multiplications are provided to a majority voter logic block 1502 that determines the sign of the summation of these results.

In the embodiment depicted, the majority voter logic block 1502 comprises a 3:2 adder tree. In other embodiments, where the number of fan-in neurons to a particular neuron (and thus the number of bitwise multiplications performed for the activation function) is a different size, an adder tree having another appropriate size may be used.

The adder tree is implemented using CLBs 1100G-1100M which each have their control signal F set to 1, thus each of these CLBs are configured as full adders. In addition to summing the results of the bitwise multiplications, the majority voter logic block adds an additive bias value B (not to be confused with a bias value applied to a particular neuron). The bias value B operates to cause the most significant bit (i.e., $r_3$) of the sum produced by the adder to output the majority value. That is, if the sign of the result of the summation is positive, then more +1 values were supplied to the adder than −1 values, and the most significant bit will be a logical 1 (representing a positive sign). However, if the sign of the result of the summation is negative, then more −1 values were supplied to the adder than +1 values, and the most significant bit will be a logical 0 (representing a negative sign). Accordingly, the majority voter produces the majority bit of the input bits.

In a particular embodiment, the bias $B=\lfloor (2^{\lfloor log_2(n+1) \rfloor} - (n+1))/2 \rfloor$, and the position of the most significant bit is the bit at position $\lceil log_2(n+1) \rceil$, where n equals the number of fan-in neurons (plus one for a bias if applicable) considered in the summation. For example, in the embodiment depicted, the summation was for i from 0 to 8, thus n equals 9, the bias equals 3, and the sign bit is the 4th bit. As another example, when n equals 8, the bias equals 4, and the sign bit is the 4th bit. As yet another example, when n equals 7, the bias equals 0, and the sign bit is the 3rd bit.

In the embodiment depicted, the additive bias equals 3. The additive bias is implemented by applying a bias control signal 1504 of logical 1 to the $C_i$ input of CLB 1100I (indicating "b01") and $C_i$ input of 1100L (indicating "b10"), thus the adder tree is biased by "b11"=3. Any unconnected inputs to the adders of the adder tree may be coupled to a bias control signal of logical 0.

Thus, in the example depicted, only four CLBs are used to implement 7 XNOR operations and six CLBs used to implement the adder tree to add the 7 XNOR results together and compute the sign bit. In this case, the bit "$r_3$" of the adder tree result represents the activation function result (i.e., sign bit), and the remaining three output bits ($r_0$, $r_1$, and $r_2$) may be ignored.

In order to implement the connectivity shown (and other similar connectivities for neural network operations having various sizes, the connections between the CLBs can be configured by setting the control signals to the appropriate SBs (or other reconfigurable connection logic) to the appropriate values.

The example of FIG. 15 merely depicts logic to perform an activation function for a single neuron. In an actual implementation of a neural network, the sign bit (which is the activation state value for a particular neuron) may be provided (along with an appropriate synapse weight value) to a fan-out neuron for a similar calculation to be performed for that neuron. Similarly, $x_0$-$x_8$ may each be connected to an output (sign bit) of a similar logical implementation of a fan-in neuron. Thus, the CLBs may be arranged together to form a multilayered neural network having any suitable number of neurons and connectivity.

Figure 16:
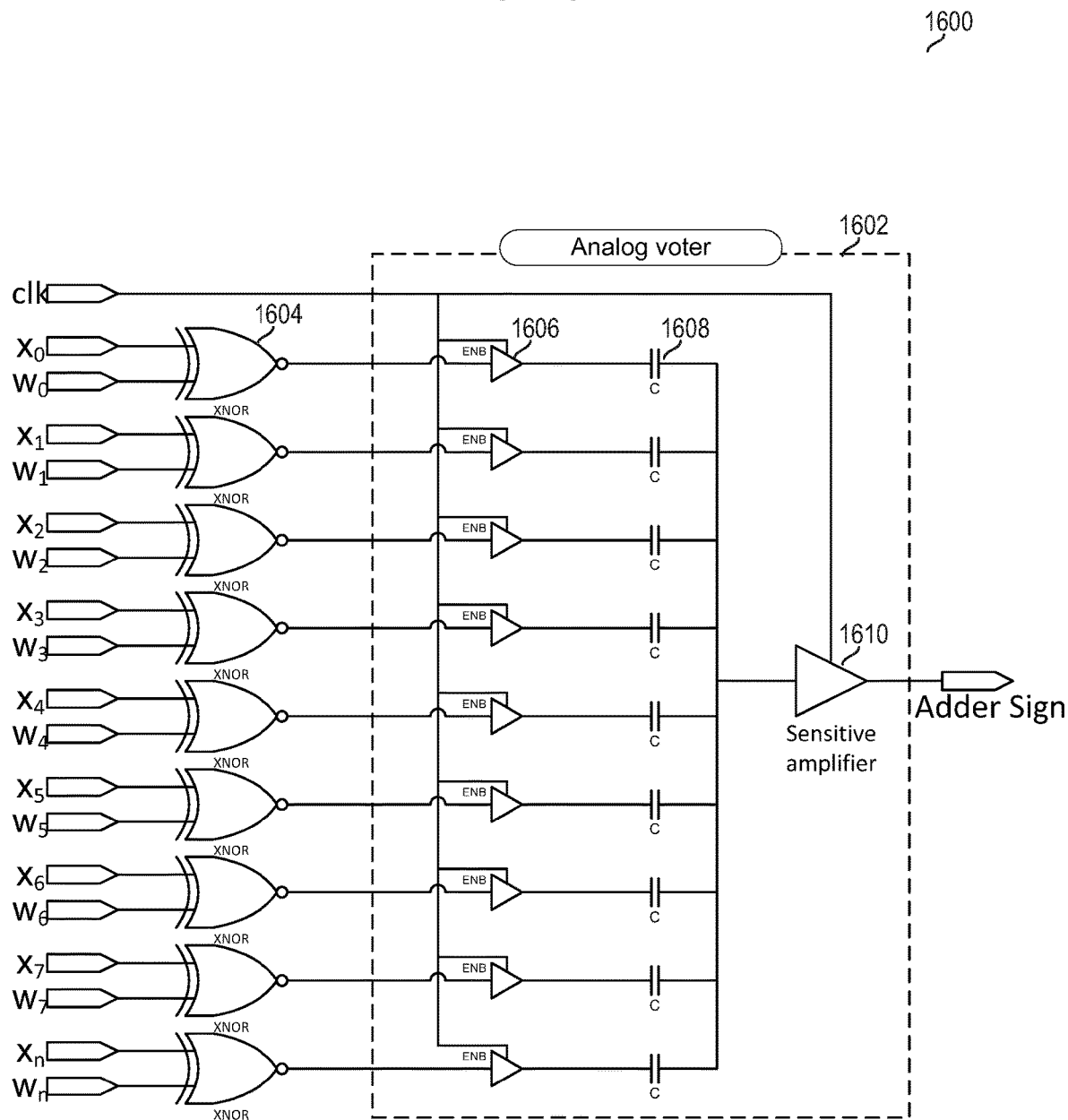
FIG. 16 illustrates an example analog majority voter coupled to a plurality of bitwise multipliers in accordance with certain embodiments.

FIG. 16 illustrates an example analog majority voter 1602 coupled to a plurality of bitwise multipliers 1604 in accordance with certain embodiments. In various embodiments, an analog majority voter 1602 may be used to compute the sign of the sum of the outputs of the bitwise multipliers 1604. In various embodiments, an analog majority voter 1602 may be more energy efficient, faster, and require less chip area than a comparable digital majority voter (e.g., an adder tree with an additive bias). Analog majority voter 1602 comprises a set of capacitors 1608 that are each coupled through a clocked buffer 1606 to a result of a bitwise multiplication performed by a respective XNOR gate 1604. The capacitors 1608 are connected in parallel to each other and in series with an amplifier 1610 that is operable to generate an output indicative of the sign of the sum of the outputs of the bitwise multipliers.

The bitwise multipliers 1604 and the analog majority voter 1602 are operable to perform the activation function described above for n+1 inputs (e.g., activation state values from n fan-in neurons and one neuron bias). FIG. 16 depicts an example 3×3 convolution computation or 9×1 full connection operation for a binary neural network when n equals 8. For a general integer number n, if more than a half of the n productions of $x_iw_i$ (for i=0, 1, 2, . . . n) are '1' (indicating a +1 value), then the analog voter output ("adder sign") will be '1', but if more than a half of the n productions are '0' (indicating a −1 value), then the analog voter output will be '0'.

Although a particular implementation is shown, other embodiments may include an analog majority voter (or comparable logic) that is implemented using any suitable circuitry. For example, a minority voter (e.g., in which XOR gates replace the XNOR gates) that produces the inverse of the sign could be used with an inverter in place of the majority voter. As another example, a dual rail system may be used in which both a minority voter and a majority voter are used (with each receiving the same inputs) and the outputs of the voters are coupled to respective inputs of a differential amplifier.

The example of FIG. 16 merely depicts logic to perform an activation function for a single neuron. In an actual implementation of a neural network, the adder sign bit (which is the activation state value for a particular neuron) may be provided (along with an appropriate synapse weight value) to a fan-out neuron for a similar calculation to be performed for that neuron. Similarly, $x_0$-$x_n$ may each be connected to an output (sign bit) of a similar logical implementation of a fan-in neuron. Thus, XNOR (or XOR) gates and analog majority voters 1602 may be arranged together to form a multilayered neural network having any suitable number of neurons and connectivity.

While an analog majority voter may not produce the adder sign with 100% accuracy, the possibility of meaningful errors is very small in typical neural network implementations. Moreover, the analog majority voter could be included in the neural network training process in order to tune the weights of the neural network to reduce any negative effects the errors might cause.

When an analog majority voter is used, the logic blocks used to implement the bitwise multiplications of the weights and activation states may be simplified to XNOR or XOR gates. Thus these logic blocks may be greatly simplified in comparison to computational logic blocks 1100 as they would not include the logic to implement the full adder and to switch between the full adder and the bitwise multipliers according to the value of the control input F. However, in some embodiments, computational logic blocks 1100 could implement bitwise multipliers that are then coupled to an analog majority voter 1602.

As with the computational logic blocks 1100 and switch boxes 1300, an FPGA may include an array of analog majority voters that each include similarly valued capacitances and the same number of inputs. Thus, the analog majority voter may be used as a standard logic cell in the FPGA. In some embodiments, the FPGA could include arrays of XOR gates and/or XNOR gates to implement the bitwise multipliers. For example, a standard logic cell in an FPGA could include one XNOR gate or XOR gate with two inputs and one output or a collection of XNOR or XOR gates with a commensurate amount of inputs and outputs.

Figure 17:
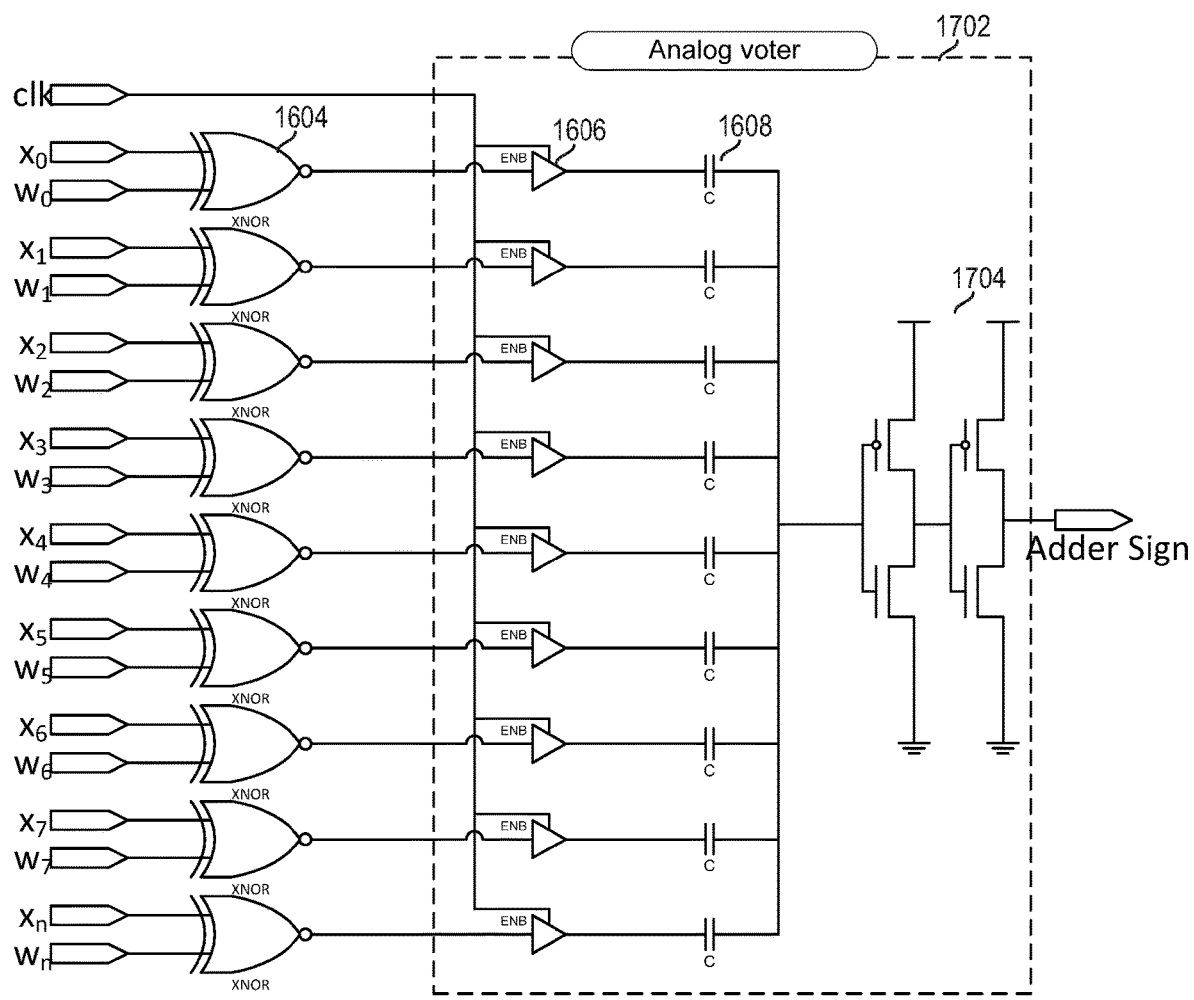
FIG. 17 illustrates an example analog majority voter coupled to a plurality of bitwise multipliers in accordance with certain embodiments.

FIG. 17 illustrates an example analog majority voter 1702 coupled to a plurality of bitwise multipliers 1604 in accordance with certain embodiments. The analog majority voter 1702 is similar to the analog majority voter 1602, but uses an inverter chain 1704 comprising two or more inverters in the amplifier stage to resolve the adder sign (e.g., to determine whether the input to the amplifier stage is greater than or less than $V_{dd}/2$).

Figure 18:
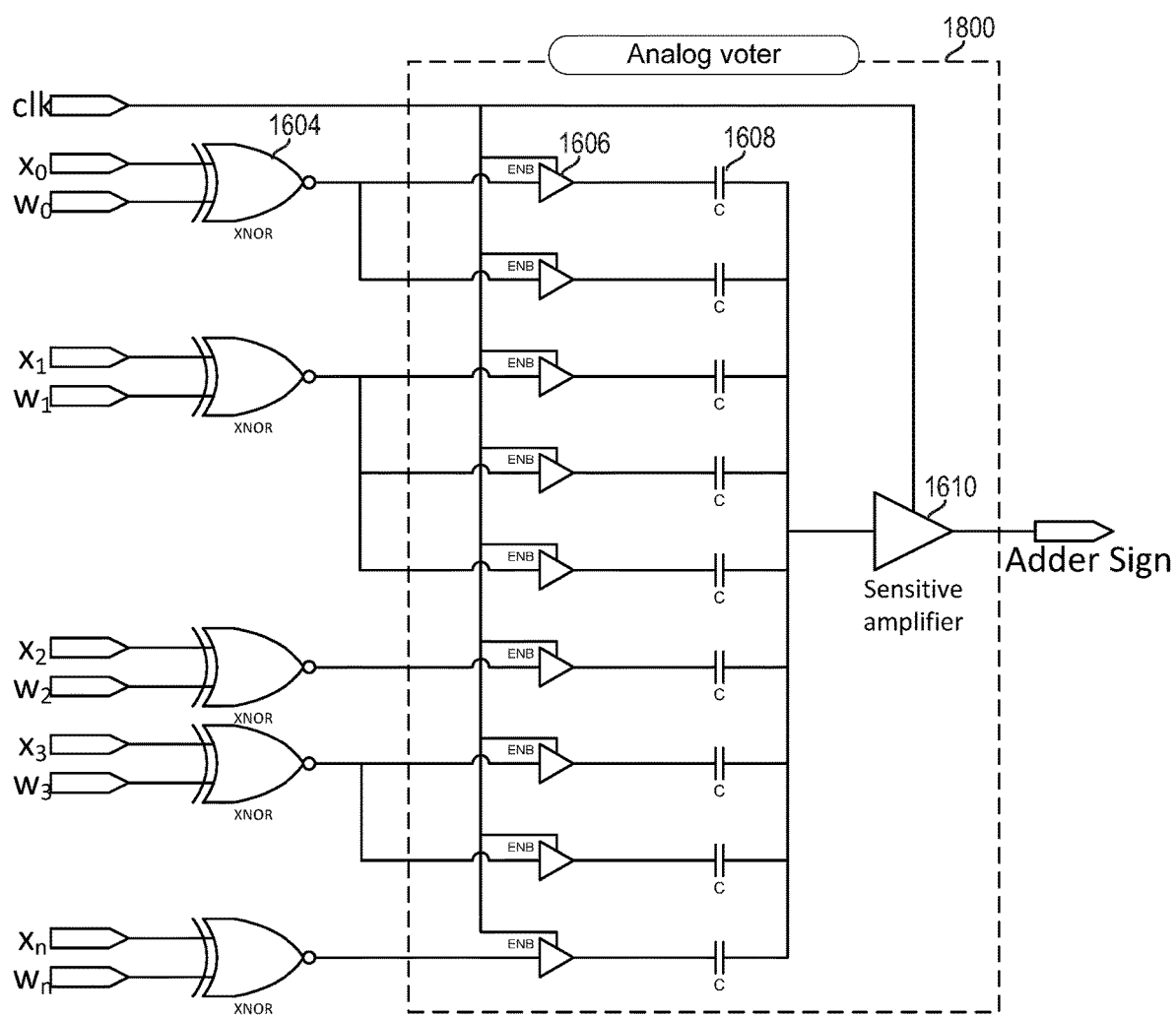
FIG. 18 illustrates an example analog majority voter coupled to a plurality of bitwise multipliers in accordance with certain embodiments.

FIG. 18 illustrates an example analog majority voter 1800 coupled to a plurality of bitwise multipliers 1604 in accordance with certain embodiments. The analog majority voter 1800 may be used to implement multi-level weighted neural networks. For example, synapses with larger magnitude weights may be connected to multiple voter inputs (i.e., where each capacitor 1608 represents a voter input). Thus, in the embodiment depicted, $w_0$ may have a weight of 2, $w_1$ may have a weight magnitude of 3, $w_2$ may have a weight magnitude of 1, $w_3$ may have a weight magnitude of 2, and $w_n$ may have a weight magnitude of 1. Such weight magnitudes assume that the capacitors 1608 have the same capacitance. Alternatively, a synapse with a higher magnitude weight value could be coupled to a single capacitor that is larger than the capacitor coupled to a synapse with a lower magnitude weight value. In various embodiments utilizing multi-level weighted neural networks, the synapse weight value $w_i$ that is used in the bitwise multiplication may be the sign (i.e., −1 or +1) of the weight (while the magnitude of the weight is represented based on the amount of capacitance coupled to the result of the bitwise multiplication.

Implementations of neural networks utilizing majority voters built from computational logic blocks 1100 could similarly implement multi-level weights by connecting the same $x_i w_i$ to multiple inputs of the majority voter.

In various embodiments, an analog majority voter that implements multi-level weights as described above may be provided as a standard logic cell on an FPGA. The cell could have various inputs that correspond to various different weight magnitudes. As one non-limiting example, the cell could include 100 inputs that each correspond to a weight having a magnitude of 1, 100 inputs that each correspond to weights having a magnitude of 1.5, and 100 inputs that each correspond to weights having a magnitude of 2, and so on.

Alternatively, each input of an analog majority voter may represent the same weight, and a larger magnitude weight may be implemented by coupling the output of a bitwise multiplier to multiple input pins of the logic cell implementing the majority voter.

Figure 19:
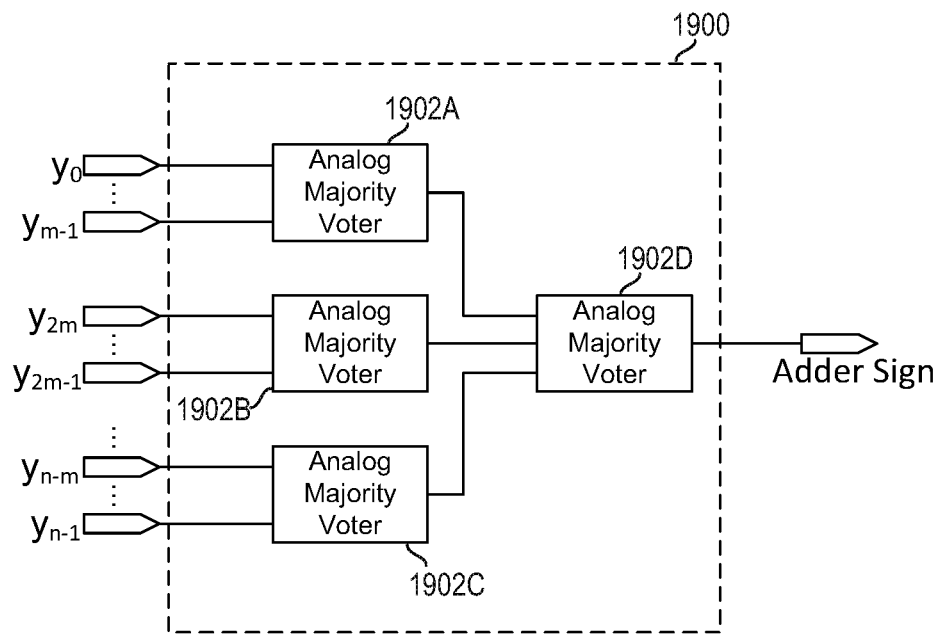
FIG. 19 illustrates an example multi-stage analog majority voter in accordance with certain embodiments.

FIG. 19 illustrates an example multi-stage analog majority voter 1900 in accordance with certain embodiments. Inputs $y_i$ may represent any suitable inputs to a majority voter, such as an output of a bitwise multiplier (e.g., that multiplies a weight value times an activation state value). Majority voter 1900 includes a first stage of analog majority voters including majority voters 1902A-C that have outputs coupled to an analog majority voter 1902D of a second stage. Other embodiments may include any number of stages of analog majority voters coupled in like manner and any number of analog majority voters in each stage (with the last stage having a single majority voter to determine the adder sign).

When the number of inputs to an analog majority voter is very large (e.g., the number of fan-in neurons in a neural network could be in the thousands), the analog majority voter may require a very sensitive amplifier to distinguish whether the input majority bit is '1' or '0'. For example, there may be a system error (E) for an analog majority voter due to manufacturing process variations. Thus an n-input analog majority voter may vote (n/2+E) "1"s as "1" (instead of the optimal value of n/2). Accordingly, the system error E becomes more significant as n increases. By including multiple stages of majority voters arranged in a tree structure as shown, the number of inputs n is decreased for each analog voter, diminishing the effect of the system error E.

Figure 20:
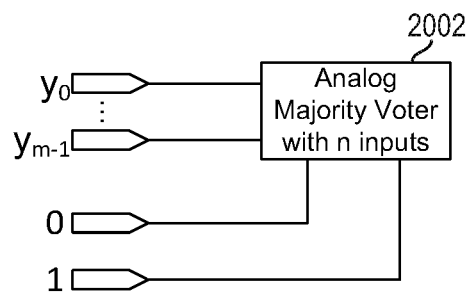
FIG. 20 illustrates an example connection scheme for an analog majority voter in accordance with certain embodiments.

FIG. 20 illustrates an example connection scheme for an analog majority voter 2002 in accordance with certain embodiments. When the number of meaningful inputs $y_0$ to $y_{m-1}$ is less than the available voter inputs, the remaining inputs pins may be connected equally to '1's and '0's so that the result of the analog majority voter is not skewed. The binding may be performed during a programming stage (e.g., specified in a configuration file) when the analog voter is predesigned and the actual connectivity is not known during the chip design phase (e.g., because the connectivity is reconfigurable).

Figure 21:
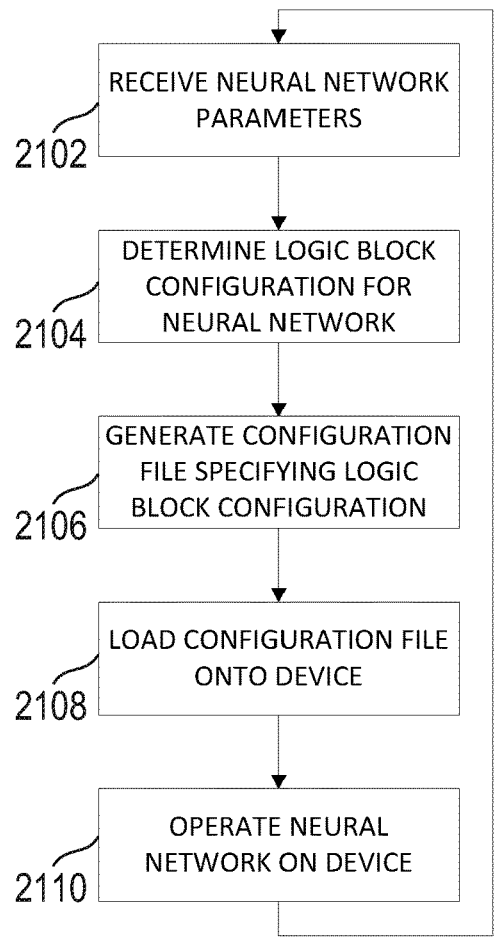
FIG. 21 illustrates an example flow for configuring a device to implement a neural network in accordance with certain embodiments.

FIG. 21 illustrates an example flow 2100 for configuring a device to implement a neural network in accordance with certain embodiments. At 2102, neural network parameters are received. The neural network parameters may include any suitable parameters. For example, the parameters may include size parameters, such as the number of neurons in the neural network, the number of layers in the neural network, the number of neurons per layer, and/or other suitable size parameters. As another example, the parameters may include synapse weight value parameters, such as the signs and magnitudes of synapse weights of the neural network. In various embodiments, the weight value parameters may be determined during a training process of a neural network that is performed, e.g., by one or more processors of a computer system and/or via other means. As another example, the parameters may include one or more neuron bias values to be applied to each neuron at each time-step of the neural network. As another example, the parameters may include connectivity information specifying how the neurons are to be connected to each other (e.g., the connectivity information may specify or at least provide information allowing the determination of the fan-in and fan-out neurons of each neuron in the neural network).

At 2104, a logic block configuration is determined for a neural network based on the neural network parameters. This may include mapping the neural network parameters onto an available device architecture. For example, an architecture of a device (e.g., an FPGA) that is to implement the neural network may include groups of available logic blocks. In some embodiments, the logic blocks (and/or a group of a specific type of logic block) may be arranged in an array on the device (i.e., the logic blocks may be located in a structured order on the device). In some embodiments, the logic blocks may be placed in a repeated pattern on the device. The logic blocks may be coupled together using reconfigurable interconnects (e.g., switch blocks 1300 or other suitable reconfigurable interconnects).

In a particular embodiment, the device includes a group of computational logic blocks 1100 (or aggregations thereof) and switch blocks 1300 (with each block having any suitable number of inputs and outputs). In another embodiment, a group of majority voters (which may be analog or digital), a group of switch blocks, and a group of XOR and/or XNOR logic blocks are provided, where each XOR or XNOR logic block comprises any number of XOR or XNOR gates that are each to couple to two inputs of the logic block and to provide an output of the logic block (which may have one output for each XOR or XNOR gate). In various embodiments, any suitable logic blocks may be provided.

The determination of the logic block configuration may include determining which logic blocks are to be used to implement the neural network and the connectivity that is to be enabled between the logic blocks (e.g., which control signals are to be supplied to switch blocks or other reconfigurable interconnect). In a particular embodiment, the determination of the logic block configuration may also include determining a plurality of configuration signals that are to be supplied to computational logic blocks in order to implement the desired functionality (e.g., to configure the computational logic blocks as bitwise multipliers or full adders or to provide an equal number of '1's and '0's to unused inputs of a majority voter).

At 2106, a configuration file that specifies the determined logic block configuration is generated. The configuration file may be compatible with logic of the device and may cause the device to implement the logic block configuration by activating various control signals of the device. At 2108, the configuration file is loaded onto the device. For example, the configuration may be loaded onto the device via a scan chain or other suitable means.

In various embodiments, a software program that is executed by a processor or other logic may receive the neural network parameters, determine the logic block configuration for the neural network, and generate the configuration file that specifies the logic block configuration. In other embodiments, a software program may perform any one or more of these operations (or other operations associated with the device that is to implement the neural network). In a particular embodiment, the software program may provide a user interface that allows a user to specify the neural network parameters and initiate the loading of the configuration file onto the device.

At 2110, the neural network operates on the device. Inputs may be applied to input neurons of the neural network (e.g., via communication ports of the device), the neural network may iterate through any suitable number of time-steps, and the device may provide the outputs of the neural network. The operations may be repeated any number of times to reconfigure the device for other implementations of neural networks.

Some of the blocks illustrated in FIG. 21 may be repeated, combined, modified or deleted where appropriate, and additional blocks may also be added to the flow. Additionally, blocks may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 530 illustrated in FIG. 5, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RANI (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the functionality of the various components such as FPGA 1000, CLB 1100, SB 1300, and the majority voters (and the various logical components therein), or other component or system described herein. "Logic" may refer to hardware, firmware, software and/or combinations of each to perform one or more functions. For example, each of the components of the FPGA 1000, CLB 1100, SB 1300, and the majority voters described herein may be hardware elements (e.g., circuitry). As another example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one embodiment, an apparatus comprises a plurality of bitwise multipliers, a bitwise multiplier of the plurality of bitwise multipliers to multiply a binary synapse weight value of a neural network by a binary activation state value of a neuron of the neural network; a plurality of majority voters, a majority voter of the plurality of majority voters to receive outputs of a first group of bitwise multipliers and to generate a majority result to indicate whether a majority of the outputs of the first group of bitwise multipliers are set to a first binary value or a second binary value; and a first plurality of reconfigurable connections coupled to outputs of the plurality of bitwise multipliers and inputs of the plurality of majority voters.

In an embodiment, the plurality of bitwise multipliers and the plurality of majority voters are implemented by a plurality of computational logic blocks, a computational logic block of the plurality of computational logic blocks comprising a pair of bitwise multipliers and a full adder, wherein outputs of the computational logic block are to be coupled to the pair of bitwise multipliers when a function signal coupled to the computational logic block is a first value and to be coupled to the full adder when the function signal is a second value. In an embodiment, the full adder and at least one bitwise multiplier of the computational logic block share an XOR or an XNOR gate. In an embodiment, the plurality of reconfigurable connections comprise a plurality of switch blocks, wherein an input of the switch block is selectively coupled to an output of the switch block via a configurable control signal. In an embodiment, the reconfigurable connections are to be set based on a configuration file to be loaded into a memory of the apparatus. In an embodiment, the majority voter comprises an adder tree including the computational logic block. In an embodiment, the adder tree is to receive an additive bias value and output a bit as the majority result. In an embodiment, the majority voter comprises an analog majority voter comprising a plurality of capacitors coupled to outputs of the first group of bitwise multipliers. In an embodiment, the analog majority voter comprises a plurality of analog majority voters arranged in a plurality of stages. In an embodiment, the analog majority voter comprises a first group of capacitors coupled to a single output of the first group of bitwise multipliers to implement a synapse weight magnitude based on the number of capacitors in the first group of capacitors.

In at least one embodiment, a method comprises configuring a first plurality of reconfigurable connections to couple outputs of a plurality of bitwise multipliers to inputs of a majority voter; performing, by each bitwise multiplier of the plurality of bitwise multipliers, a bitwise multiplication of a binary synapse weight value of a neural network and a corresponding binary activation state value of a neuron of the neural network and providing the result to an output of the bitwise multiplier; and determining, by the majority voter, a majority result that indicates whether a majority of outputs of the bitwise multipliers are set to a first binary value or a second binary value.

In an embodiment, the method further comprises setting a value of a function signal of a computational logic block to cause the computational logic block to implement at least one bitwise multiplier of the plurality of bitwise multipliers, wherein the computational logic block comprises a pair of bitwise multipliers and a full adder, wherein outputs of the computational logic block are to be coupled to the pair of bitwise multipliers when the function signal is a first value and to be coupled to the full adder when the function signal is a second value. In an embodiment, the full adder and at least one bitwise multiplier of the computational logic block share an XOR or an XNOR gate. In an embodiment, the majority voter comprises an adder tree including the computational logic block. In an embodiment, the majority voter comprises an analog majority voter comprising a plurality of capacitors coupled to outputs of the plurality of bitwise multipliers. In an embodiment, the plurality of reconfigurable connections comprise a plurality of switch blocks, wherein an input of the switch block is selectively coupled to an output of the switch block via a configurable control signal. In an embodiment, the reconfigurable connections are to be set based on a configuration file to be loaded into a memory of the apparatus. In an embodiment, the adder tree is to receive an additive bias value and output a bit as the majority result. In an embodiment, the analog majority voter comprises a plurality of analog majority voters arranged in a plurality of stages. In an embodiment, the analog majority voter comprises a first group of capacitors coupled to a single output of the first group of bitwise multipliers to implement a synapse weight magnitude based on the number of capacitors in the first group of capacitors.

In at least one embodiment, at least one machine readable storage medium includes instructions stored thereon, the instructions when executed by a machine to cause the machine to generate a configuration file, the configuration file to be loaded onto a device to cause the device to configure a first plurality of reconfigurable connections to couple outputs of a plurality of bitwise multipliers to inputs of a majority voter perform, by each bitwise multiplier of the plurality of bitwise multipliers, a bitwise multiplication of a binary synapse weight value of a neural network and a corresponding binary activation state value of a neuron of the neural network and providing the result to an output of the bitwise multiplier; and determine, by the majority voter, a majority result that indicates whether a majority of the outputs of the bitwise multipliers are set to a first binary value or a second binary value.

In an embodiment, the configuration file is further to cause the FPGA to set a value of a function signal of a computational logic block to cause the computational logic block to implement at least one bitwise multiplier of the plurality of bitwise multipliers, wherein the computational logic block comprises a pair of bitwise multipliers and a full adder, wherein outputs of the computational logic block are to be coupled to the pair of bitwise multipliers when the function signal is a first value and to be coupled to the full adder when the function signal is a second value. In an embodiment, the full adder and at least one bitwise multiplier of the computational logic block share an XOR or an XNOR gate. In an embodiment, the majority voter comprises an adder tree including the computational logic block. In an embodiment, the majority voter comprises an analog majority voter comprising a plurality of capacitors coupled to outputs of the plurality of bitwise multipliers.

In at least one embodiment, a system comprises means for configuring a first plurality of reconfigurable connections to couple outputs of a plurality of bitwise multipliers to inputs of a majority voter; means for performing a bitwise multiplication of a binary synapse weight value of a neural network and a corresponding binary activation state value of a neuron of the neural network and providing the result to an output of a bitwise multiplier; and means for determining a majority result that indicates whether a majority of bitwise multiplication outputs are set to a first binary value or a second binary value.

In an embodiment, the system further comprises means for generating a configuration file specifying connectivity of the reconfigurable connections. In an embodiment, the system further comprises means for receiving neural network parameters and generating the configuration file based on the neural network parameters. In an embodiment, the system further comprises means for setting a value of a function signal of a computational logic block to cause the computational logic block to implement at least one bitwise multiplier, wherein the computational logic block comprises a pair of bitwise multipliers and a full adder, wherein outputs of the computational logic block are to be coupled to the pair of bitwise multipliers when the function signal is a first value and to be coupled to the full adder when the function signal is a second value. In an embodiment, In an embodiment, the full adder and at least one bitwise multiplier of the computational logic block share an XOR or an XNOR gate.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a plurality of bitwise multipliers, a bitwise multiplier of the plurality of bitwise multipliers to multiply a binary synapse weight value of a neural network by a binary activation state value of a neuron of the neural network;
   a plurality of majority voters, a majority voter of the plurality of majority voters to receive outputs of a first group of bitwise multipliers and to generate a majority result to indicate whether a majority of the outputs of the first group of bitwise multipliers are set to a first binary value or a second binary value; and
   a first plurality of reconfigurable connections coupled to outputs of the plurality of bitwise multipliers and inputs of the plurality of majority voters.

2. The apparatus of claim 1, wherein the plurality of bitwise multipliers and the plurality of majority voters are implemented by a plurality of computational logic blocks, a computational logic block of the plurality of computational logic blocks comprising a pair of bitwise multipliers and a full adder, wherein outputs of the computational logic block are to be coupled to the pair of bitwise multipliers when a function signal coupled to the computational logic block is a first value and to be coupled to the full adder when the function signal is a second value.

3. The apparatus of claim 2, wherein the full adder and at least one bitwise multiplier of the computational logic block share an XOR or an XNOR gate.

4. The apparatus of claim 1, wherein the plurality of reconfigurable connections comprise a plurality of switch blocks, wherein an input of the switch block is selectively coupled to an output of the switch block via a configurable control signal.

5. The apparatus of claim 1, wherein the reconfigurable connections are to be set based on a configuration file to be loaded into a memory of the apparatus.

6. The apparatus of claim 2, wherein the majority voter comprises an adder tree including the computational logic block.

7. The apparatus of claim 6, wherein the adder tree is to receive an additive bias value and output a bit as the majority result.

8. The apparatus of claim 1, wherein the majority voter comprises an analog majority voter comprising a plurality of capacitors coupled to outputs of the first group of bitwise multipliers.

9. The apparatus of claim 8, wherein the analog majority voter comprises a plurality of analog majority voters arranged in a plurality of stages.

10. The apparatus of claim 8, wherein the analog majority voter comprises a first group of capacitors coupled to a single output of the first group of bitwise multipliers to implement a synapse weight magnitude based on the number of capacitors in the first group of capacitors.

11. A method comprising:
    configuring a first plurality of reconfigurable connections to couple outputs of a plurality of bitwise multipliers to inputs of a majority voter;
    performing, by each bitwise multiplier of the plurality of bitwise multipliers, a bitwise multiplication of a binary synapse weight value of a neural network and a corresponding binary activation state value of a neuron of the neural network and providing the result to an output of the bitwise multiplier; and
    determining, by the majority voter, a majority result that indicates whether a majority of outputs of the bitwise multipliers are set to a first binary value or a second binary value.

12. The method of claim 11, further comprising setting a value of a function signal of a computational logic block to cause the computational logic block to implement at least one bitwise multiplier of the plurality of bitwise multipliers, wherein the computational logic block comprises a pair of bitwise multipliers and a full adder, wherein outputs of the computational logic block are to be coupled to the pair of bitwise multipliers when the function signal is a first value and to be coupled to the full adder when the function signal is a second value.

13. The method of claim 12 wherein the full adder and at least one bitwise multiplier of the computational logic block share an XOR or an XNOR gate.

14. The method of claim 12, wherein the majority voter comprises an adder tree including the computational logic block.

15. The method of claim 11, wherein the majority voter comprises an analog majority voter comprising a plurality of capacitors coupled to outputs of the plurality of bitwise multipliers.

16. At least one machine readable storage medium having instructions stored thereon, the instructions when executed by a machine to cause the machine to generate a configuration file, the configuration file to be loaded onto a device to cause the device to:
    configure a first plurality of reconfigurable connections to couple outputs of a plurality of bitwise multipliers to inputs of a majority voter;
    perform, by each bitwise multiplier of the plurality of bitwise multipliers, a bitwise multiplication of a binary synapse weight value of a neural network and a corresponding binary activation state value of a neuron of the neural network and providing the result to an output of the bitwise multiplier; and
    determine, by the majority voter, a majority result that indicates whether a majority of the outputs of the bitwise multipliers are set to a first binary value or a second binary value.

17. The at least one medium of claim 16, wherein the configuration file is further to cause the FPGA to set a value of a function signal of a computational logic block to cause the computational logic block to implement at least one bitwise multiplier of the plurality of bitwise multipliers, wherein the computational logic block comprises a pair of bitwise multipliers and a full adder, wherein outputs of the computational logic block are to be coupled to the pair of bitwise multipliers when the function signal is a first value and to be coupled to the full adder when the function signal is a second value.

18. The at least one medium of claim 17, wherein the full adder and at least one bitwise multiplier of the computational logic block share an XOR or an XNOR gate.

19. The at least one medium of claim 17, wherein the majority voter comprises an adder tree including the computational logic block.

20. The at least one medium of claim 16, wherein the majority voter comprises an analog majority voter comprising a plurality of capacitors coupled to outputs of the plurality of bitwise multipliers.

* * * * *